(12) United States Patent
Kim

(10) Patent No.: US 10,170,566 B2
(45) Date of Patent: *Jan. 1, 2019

(54) SEMICONDUCTOR DEVICE HAVING AIR GAP AND METHOD FOR MANUFACTURING THE SAME, MEMORY CELL HAVING THE SAME AND ELECTRONIC DEVICE HAVING THE SAME

(71) Applicant: SK hynix Inc., Gyeonggi-do (KR)

(72) Inventor: Seung-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/673,032

(22) Filed: Aug. 9, 2017

(65) Prior Publication Data

US 2017/0338317 A1 Nov. 23, 2017

Related U.S. Application Data

(63) Continuation of application No. 14/858,732, filed on Sep. 18, 2015, now Pat. No. 9,799,739.

(30) Foreign Application Priority Data

Apr. 20, 2015 (KR) ........................ 10-2015-0055446

(51) Int. Cl.
| H01L 27/108 | (2006.01) |
| H01L 29/40 | (2006.01) |
| H01L 29/06 | (2006.01) |
| H01L 29/423 | (2006.01) |
| H01L 29/10 | (2006.01) |

(Continued)

(52) U.S. Cl.
CPC .......... *H01L 29/407* (2013.01); *H01L 21/764* (2013.01); *H01L 29/0649* (2013.01); *H01L 29/1083* (2013.01); *H01L 29/4236* (2013.01); *H01L 29/66666* (2013.01); *H01L 29/7827* (2013.01); *H01L 27/10876* (2013.01); *H01L 27/10885* (2013.01)

(58) Field of Classification Search
CPC ......... H01L 27/10876; H01L 27/10885; H01L 29/407; H01L 29/4236

See application file for complete search history.

(56) References Cited

U.S. PATENT DOCUMENTS 9,799,739 B2 * 10/2017 Kim .................... H01L 29/0649
2010/0096693 A1 4/2010 Hong (Continued)

OTHER PUBLICATIONS

Office Action issued by the United States Patent and Trademark Office for U.S. Appl. No. 15/258,588 in the same family tree dated Sep. 6, 2017.

(Continued)

*Primary Examiner* — Frederick B Hargrove

(74) *Attorney, Agent, or Firm* — IP & T Group LLP

(57) ABSTRACT

A semiconductor device including a semiconductor substrate including a plurality of active regions and a device isolation region for isolating the plurality of active regions; and a buried bit line and a buried gate electrode which are formed in the semiconductor substrate. The device isolation region includes a first device isolation region extending in a first direction and a second device isolation region extending in a second direction crossing with the first direction and having a shield pillar formed therein.

5 Claims, 43 Drawing Sheets

(51) Int. Cl.
*H01L 21/764* (2006.01)
*H01L 29/66* (2006.01)
*H01L 29/78* (2006.01)

(56) References Cited

U.S. PATENT DOCUMENTS

| | | | |
|---|---|---|---|
| 2014/0015027 A1* | 1/2014 | Mikasa | H01L 29/66666 257/296 |
| 2014/0015034 A1* | 1/2014 | Ryu | H01L 27/108 257/329 |
| 2014/0117438 A1 | 5/2014 | Meiser et al. | |

OTHER PUBLICATIONS

Notice of Allowance issued by the United States Patent and Trademark Office for U.S. Appl. No. 15/258,588 in the same family tree dated May 11, 2018.

* cited by examiner

SEMICONDUCTOR DEVICE HAVING AIR GAP AND METHOD FOR MANUFACTURING THE SAME, MEMORY CELL HAVING THE SAME AND ELECTRONIC DEVICE HAVING THE SAME

CROSS-REFERENCE TO RELATED APPLICATIONS

This application is a continuation of U.S. patent application Ser. No. 14/858,732 filed on Sep. 18, 2015, which claims priority of Korean Patent Application No. 10-2015-0055446, filed on Apr. 20, 2015. The disclosure of each of the foregoing applications is incorporated herein by reference in its entirety.

BACKGROUND

1. Field

Exemplary embodiments of the present invention relate to a semiconductor device, and more particularly, to a semiconductor device having an air gap, a method for manufacturing the same, a memory cell having the same, and an electronic device having the same.

2. Description of the Related Art

As a semiconductor device is highly integrated, parasitic capacitance between neighboring conductive structures exerts a substantial influence on performance of the semiconductor device.

SUMMARY

An embodiment of the present invention is directed to a semiconductor device capable of suppressing passing gate effect and a method for manufacturing the same.

In accordance with an embodiment of the present invention, a semiconductor device may include a semiconductor substrate having a plurality of active regions and a device isolation region for isolating the plurality of active regions from each other; and a buried bit line and a buried gate electrode which are formed in the semiconductor substrate, wherein the device isolation region includes a first device isolation region extending in a first direction and a second device isolation region extending in a second direction crossing with the first direction and having a shield pillar. The shield pillar may be electrically coupled to the semiconductor substrate. The shield pillar may include polysilicon doped with boron. The semiconductor device may further including a first isolation trench extending in the first direction, and wherein the first device isolation region is formed in the first isolation trench. The semiconductor device may including a second isolation trench extending in the second direction, and wherein the second device isolation region is formed in the second isolation trench. The second device isolation region may include: a liner formed on sidewalls of the second isolation trench; and an isolation dielectric layer covering the shield pillar, wherein the liner may be positioned between the shield pillar and a sidewall of the second isolation trench. The semiconductor device may further including a gate trench having a bottom surface, a first side surface and a second side surface opposite to the first side surface, wherein the buried gate electrode may be formed in the gate trench. The gate trench may include: a first trench extending in the second direction, and a second trench and a third trench each extending from the first trench and extending in the first direction. The buried gate electrode may include: a first electrode buried in the first trench of the gate trench; a second electrode buried in the second trench of the gate trench; and a third electrode buried in the third trench of the gate trench. The semiconductor device may further including a bit line trench extending in a third direction crossing with the first and second directions, wherein the buried bit line may be formed in the bit line trench. The semiconductor device may further including: a body trench under the buried bit line; and a punch-through preventing layer formed in the body trench. Each of the active region may include a body and a pillar vertically extending over the body, wherein the pillar may include: a first junction region electrically coupled to the buried bit line; a second junction region vertically positioned from the first junction region; and a channel region positioned between the first junction region and the second junction region, and overlapping with the buried gate electrode. Each of the active region has a major axis and a minor axis, the first isolation region may be positioned between the minor axes of neighboring active regions, and the second isolation region may be positioned between the major axes of the neighboring active regions. The shield pillar may be positioned between the major axes of the neighboring active regions.

In accordance with another embodiment of the present invention, a semiconductor device may include a semiconductor substrate having a plurality of active regions and a device isolation region for isolating the plurality of active regions from each other; and a buried bit line and a buried gate electrode which are formed in the semiconductor substrate, wherein the device isolation region may include a first device isolation region extending in a first direction and a second device isolation region extending in a second direction crossing with the first direction, and having an air gap and a conductive shield pillar, wherein each of the active region may be defined by the first device isolation region and the second device isolation region. The conductive shield pillar may be electrically coupled to the semiconductor substrate. The conductive shield pillar may include polysilicon doped with boron. The second device isolation region may include an isolation dielectric layer covering the conductive shield pillar and the air gap. Each of the active region has a minor axis and a major axis, the first device isolation region may be positioned between the minor axes of neighboring active regions, and the second device isolation region may be positioned between the major axes of the neighboring active regions. The conductive shield pillar may be independently positioned between the major axes of the neighboring active regions.

In accordance with yet another embodiment of the present invention, a semiconductor device may include a semiconductor substrate including a plurality of active regions and a device isolation region for isolating the plurality of active regions from each other; and a buried bit line and a buried gate electrode which are formed in the semiconductor substrate, wherein the device isolation region comprises a first device isolation region extending in a first direction and having a first air gap and a second device isolation region extending in a second direction crossing the first direction and having a second air gap and a conductive shield pillar, and wherein the active region is defined by the first device isolation region and the second device isolation region. The conductive shield pillar may be electrically coupled to the semiconductor substrate. The conductive shield pillar may include polysilicon doped with boron. Each of the active region has a minor axis and a major axis, wherein the first device isolation region may be positioned between the minor axes of neighboring active regions, and wherein the second device isolation region may be positioned between the major axes of the neighboring active regions. The conductive shield pillar and the second air gap are positioned between the major axes of neighboring active regions. The first air gap may be positioned between minor axes of the neighboring active regions.

In accordance with still another embodiment of the present invention, a method for manufacturing a semiconductor device may include forming a line type active region by etching a semiconductor substrate; forming a plurality of island type active regions and an isolation trench by cutting the line type active region; forming a device isolation region comprising a shield pillar, wherein the shield pillar is formed in the isolation trench and is electrically coupled to the semiconductor substrate; and forming a buried bit line and a buried gate electrode which are formed in each of the island type active region. The forming the device isolation region may include: forming a spacer over a sidewall of the isolation trench; forming a conductive material filling the isolation trench over the spacer; forming the shield pillar by recessing the conductive material; filling an isolation dielectric layer over the shield pillar. The shield pillar may include polysilicon doped with boron.

In accordance with still another embodiment of the present invention, a method for a semiconductor device may include forming a line type active region by etching a semiconductor substrate; forming a plurality of island type active regions and an isolation trench by cutting the line type active region; forming a spacer over a sidewall of the isolation trench; forming a shield pillar partially filling the isolation trench over the spacer; forming an air gap by removing the spacer; forming a device isolation region by filling an isolation dielectric layer in the isolation trench and over the air gap and the shield pillar; and forming a buried bit line and a buried gate electrode which are formed in each of the island type active region. The shield pillar may include polysilicon doped with boron.

In accordance with still another embodiment of the present invention, a method for manufacturing a semiconductor device may include forming a line type active region and a first isolation trench by etching a semiconductor substrate; forming a first device isolation region including a dielectric pillar in the first isolation trench; forming a plurality of island type active regions and a second isolation trench by cutting the line type active region and the first device isolation region; forming a spacer over a sidewall of the second isolation trench; forming a shield pillar partially filling the second isolation trench and over the spacer; forming a first air gap by removing the spacer; forming a second device isolation region by filling the second isolation trench with an isolation dielectric layer and over the first air gap and the shield pillar; forming a buried bit line and a buried gate electrode which are formed in each of the island type active region; and forming a second air gap in the first isolation trench by removing the dielectric pillar. The forming the first device isolation region may include: forming a first liner layer over a sidewall of the first isolation trench; forming the dielectric pillar partially filling the first isolation trench and over the first liner layer; and filling the first isolation trench with the first isolation dielectric layer, wherein the first isolation dielectric layer is formed over the dielectric pillar. The dielectric pillar may include silicon germanium. The forming the second air gap by removing the dielectric pillar comprises wet etching the dielectric pillar. The shield pillar may include polysilicon doped with boron. The forming the first air gap by removing the spacer comprises wet etching the spacer.

DETAILED DESCRIPTION

Figure 1:
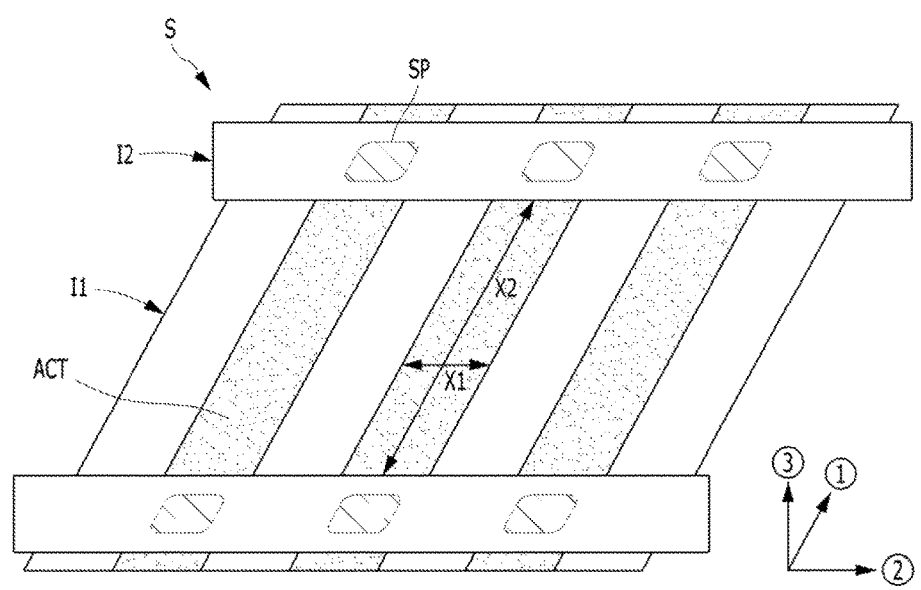
FIG. 1 is a cross-sectional view illustrating a device isolation region in accordance with a first embodiment

Exemplary embodiments of the present invention will be described below in more detail with reference to the accompanying drawings. The present invention may, however, be embodied in different forms and should not be construed as limited to the embodiments set forth herein. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

FIG. 1 is a cross-sectional view illustrating a device isolation region in accordance with a first embodiment.

Referring to FIG. 1, a device isolation region and an active region ACT may be formed in a substrate S. The device isolation region may include a first device isolation region I1 and a second device isolation region I2. The active region ACT may be defined by the first device isolation region I1 and the second device isolation region I2. The first device isolation region I1 may extend in a first direction ①, and the second device isolation region I2 may extend in a second direction ② crossing with the first direction ①. The first device isolation region I1 may become discontinuous by the second device isolation region I2. The first device isolation region I1 and the second device isolation region I2 may be shallow trench isolation (STI) regions which are formed by trench etching. The first and second device isolation regions I1 and I2 may be formed by filling isolation trenches (not numbered) with a dielectric material, respectively. The first device isolation region I1 and second device isolation region I2 may be formed of the same material or different materials. For example, the first device isolation region I1 and the second device isolation region I2 may include silicon oxide, silicon nitride or a combination thereof. The second device isolation region I2 may have a shield pillar SP.

The active region ACT may be an island type. A plurality of active regions ACT may be arrayed in the second direction ② and the first device isolation region I1 is interposed therebetween. The plurality of active regions ACT may be arrayed with the same spacing and size as each other. The active region ACT may have a major axis X2 and a minor axis X1. The second device isolation region I2 may be positioned between major axes X2 of two neighboring active regions ACT. The first device isolation region I1 may be positioned between minor axes X1 of the two neighboring active regions ACT.

According to FIG. 1, the second device isolation region I2 having a shield pillar SP may be positioned between major axes X2 of two active regions ACT. Various semiconductor devices may be formed in the active region ACT.

Figure 2A:
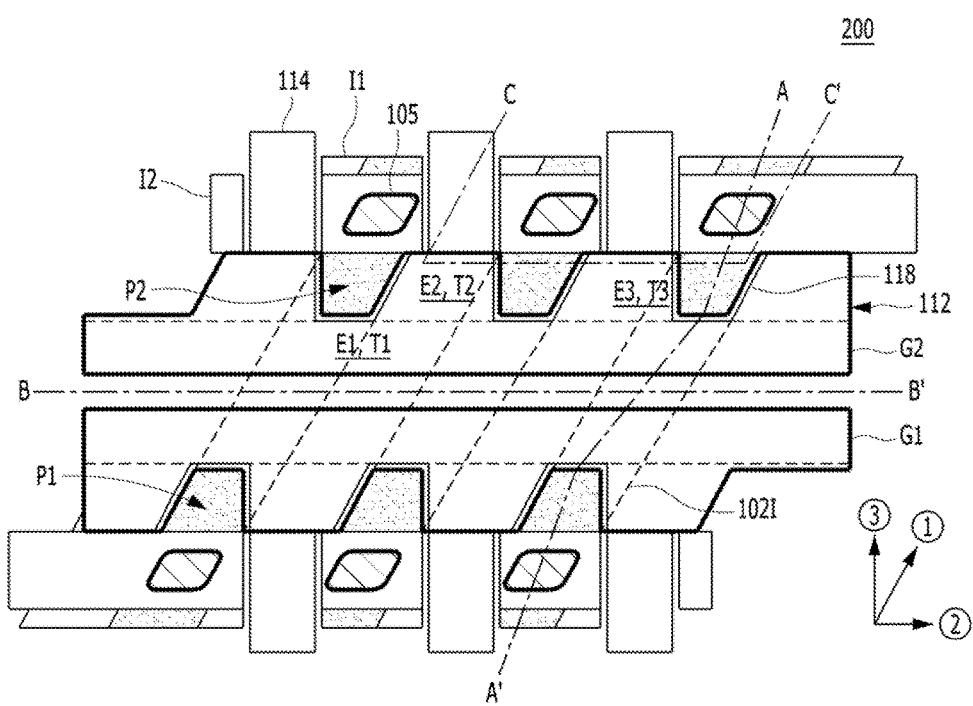
FIG. 2A is a plan view illustrating a semiconductor device in accordance with the first embodiment.
Figure 2B:
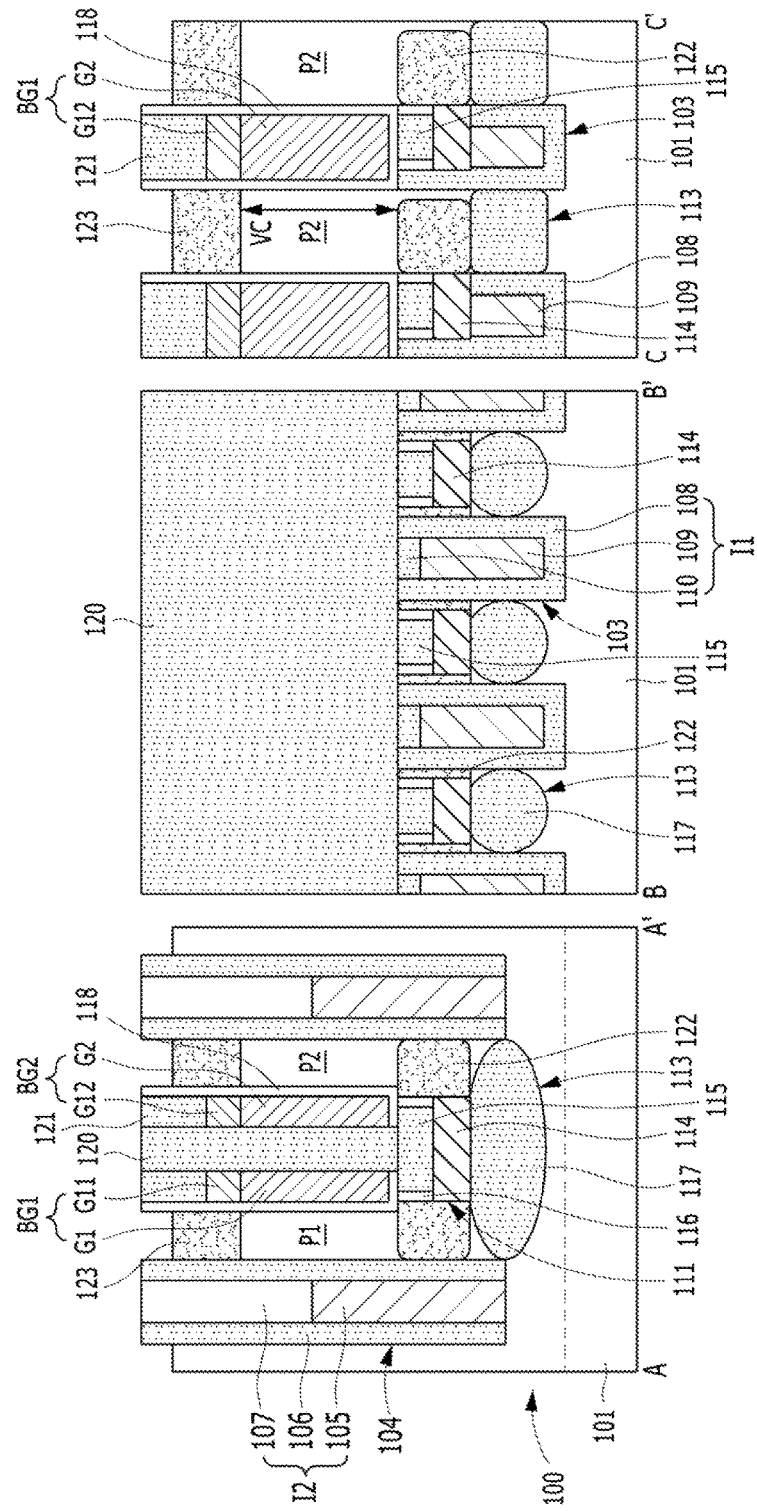
FIG. 2B is a cross-sectional view taken along the lines A-A', B-B' and C'C' of FIG. 2A.

Hereinafter, an example of a semiconductor device in accordance with the first embodiment will be described. FIG. 2A is a plan view illustrating a semiconductor device in accordance with a first embodiment. FIG. 2B is a cross-sectional view taken along the line A-A', B-B' and C'C' of FIG. 2A. A semiconductor device 200 may include a memory cell.

The semiconductor device 200 may include a substrate 100. The substrate 100 may include a semiconductor substrate. The substrate 100 may be formed of a silicon-containing material. The substrate 100 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In another embodiment, the substrate 100 may include semiconductor material such as germanium. The substrate 100 may include III/V group semiconductor materials, for example, a compound semiconductor substrate such as GaAs. Further, the substrate 100 may include a silicon-on-insulator (SOI) substrate.

A device isolation region and an active region 102I may be formed in the substrate 100. The device isolation region may include a first device isolation region I1 and a second device isolation region I2. The active region 102I may be defined by the first device isolation region I1 and the second device isolation region I2. A part of the substrate 100 under the active region 102I may become a bulk 101. The first device isolation region I1 may extend in a first direction ①, and the second device isolation region I2 may extend in a second direction ② crossing with the first direction ①. The first device isolation region I1 may become discontinuous by the second device isolation region I2. The first device isolation region I1 and the second device isolation region I2 may be STI regions which are formed by trench etching. The first and second device isolation regions I1 and I2 may be formed by filling first and second isolation trenches 103 and 104 with a dielectric material, respectively.

The first device isolation region I1 and the second device isolation region I2 may be formed of the same material as each other or different materials from each other. For example, the first device isolation region I1 and the second device isolation region I2 may include silicon oxide, silicon nitride or a combination thereof. The second device isolation region I2 may include a spacer 106, a shield pillar 105 and a second isolation dielectric layer 107. The second device isolation region I2 may be formed in a second isolation trench 104. Thus, the shield pillar 105 may be formed in the second device isolation region I2. The shield pillar 105 may be electrically coupled to the substrate 100. The first device isolation region I1 may include a liner 108, a dielectric pillar 109 and a first isolation dielectric layer 110.

The active region 102I may be an island type. A plurality of active regions 102I may be arrayed in a second direction ② and the first device isolation region I1 may be interposed therebetween. The plurality of active region 102I may be arrayed with the same spacing and size as each other. The active region 102I may have a major axis and a minor axis (see, FIG. 1). The second device isolation region I2 may be positioned between the major axes X2 of two active regions 102I. The first device isolation region I1 may be positioned between the minor axes X1 of two active regions 102I. The active region 102I may include a first pillar P1 and a second pillar P2. The first pillar P1 and the second pillar P2 may form a pair and be symmetrical to each other. One side surface of each of the first pillar P1 and the second pillar P2 may contact the second device isolation region I2.

The substrate 100 may include a plurality of trenches. The trenches may include a bit line trench 111, a gate trench 112 on the bit line trench 111, and a body trench 113 under the bit line trench 111. The bit line trench 111 may extend in a third direction ③. The third direction ③ may be a direction crossing with the first direction ① and the second direction ②. The gate trench 112 may extend in the second direction ②. The second direction ② may be a direction crossing with the first direction ① and the third direction ③. The body trench 113 may extend in the first direction ① and the length of the body trench 113 may be the same as the active region 102I when measured along the first direction. The first pillar P1 and the second pillar P2 may be spaced from each other by the gate trench 112.

A buried bit line 114 may be formed in the bit line trench 111. A bit line capping layer 115 may be formed on the buried bit line 114. The buried bit line 114 may include a low resistivity metal. The buried bit line 114 may include tungsten. A bit line capping liner 116 may be positioned between the bit line capping layer 115 and the bit line trench 111. The bit line capping layer 115 and the bit line capping liner 116 may include a dielectric material. The bit line capping layer 115 and the bit line capping liner 116 may include silicon oxide, silicon nitride or a combination thereof.

The bit line capping layer 115 may cover the top surface of the buried bit line 114. Accordingly, the buried bit line 114 may also be referred to as an embedded buried bit line in the substrate 100. A punch-through preventing layer 117 may be formed under the buried bit line 114. The punch-through preventing layer 117 may be formed of a dielectric material. The punch-through preventing layer 117 may prevent punch between neighboring buried bit lines 114. The buried bit line 114 may float from a bulk 101 of the substrate 100 by the punch-through preventing layer 117.

The gate trench 112 may be between the first pillar P1 and the second pillar P2. A pair of gate electrodes BG1 and BG2 may be formed in the gate trench 112. In the pair of gate electrodes, a first gate electrode BG1 may overlap with a side surface of the first pillar P1 and a second gate electrode BG2 may overlap with a side surface of the second pillar P2. The first gate electrode BG1 and the second gate electrode BG2 may be symmetrical to each other.

A gate dielectric layer 118 may be formed on sidewalls of the first pillar P1 and the second pillar P2. The first gate electrode BG1 and the second gate electrode BG2 may be covered by first and second gate capping layers 120 and 121. The top surfaces of the first and second gate electrodes BG1 and BG2 may be positioned at a level lower than the top surfaces of the first pillar P1 and the second pillar P2. The top surfaces of the first and second gate capping layer 120 and 121 may be at the same level as the top surfaces of the first pillar P1 and second pillar P2.

Since the first and second gate electrodes BG1 and BG2 are positioned within the gate trench 112 and the top and side surfaces thereof are covered by the first and second gate capping layers 120 and 121, the first and second gate electrodes BG1 and BG2 may have buried structures. They may also be referred to as buried gate electrodes. The semiconductor device 200 may be applied to a memory cell. Therefore, the first and second gate electrodes BG1 and BG2 may become buried word lines.

A gate dielectric layer 118 may be formed on sidewalls of the gate trench 112. That is, the gate dielectric layer 118 may cover the gate trench 112. Moreover, the gate dielectric layer 118 may cover the lower side surfaces and the upper side surfaces of the first pillar P1 and second pillar P2.

The gate dielectric layer 118 may include silicon oxide, silicon nitride, silicon oxynitride, a high-k material or a combination thereof. The high-k material may include a material which has a dielectric constant higher than the dielectric constant of silicon oxide. For example, the high-k material may include a material which has a dielectric constant higher than 3.9. For another example, the high-k material may include a material which has a dielectric constant higher than 10. Yet in another example, the high-k material may include a material which has a dielectric constant of 10 to 30.

The high-k material may include at least one metallic element. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. In another embodiment, other high-k materials known in the art may be used.

The bottom surfaces of the first and second gate electrodes BG1 and BG2 may contact the bit line capping layer 115. That is, the bit line capping layer 115 may be positioned between the first and second gate electrodes BG1 and BG2 and the bit line 114. The first and second gate electrodes BG1 and BG2 may overlap with the side surfaces of the first and second pillars P1 and P2, respectively.

A second junction region 123 and a first junction region 122 may be formed in the first and second pillars P1 and P2. The first junction region 122 may be positioned at the bottom of the first and second pillars P1 and P2, and the second junction region 123 may be positioned at the top of the first and second pillars P1 and P2. The first junction region 122 may be electrically coupled to the buried bit line 114. The first junction region 122 may be positioned at a level lower than the second junction region 123.

A vertical channel VC may be vertically formed between the first junction region 122 and the second junction region 123. The first junction region 122 and the second junction region 123 may be regions where a conductive type impurity is doped. For example, the conductive type impurity may include phosphorus (P), arsenic (As), antimony (Sb) or boron (B). The first junction region 122 and the second junction region 123 may be doped with the same conductive type impurity as each other. The first junction region 122 and the second junction region 123 may respectively correspond to a source region and a drain region.

The first and second gate electrodes BG1 and BG2 may be a stack of lower gate electrodes G1 and G2 and upper gate electrodes G11 and G12, respectively. The first gate electrode BG1 may include the first lower gate electrode G1 and the first upper gate electrode G11. The second gate electrode BG2 may include the second lower gate electrode G2 and the second upper gate electrode G12. The lower gate electrodes G1 and G2 may include a high work function material. The upper gate electrodes G11 and G12 may include a low work function material. Threshold voltage may be controlled by the lower gate electrodes G1 and G2 with the high work function. Gate-induced drain leakage may be improved by the upper gate electrodes G11 and G12 with the low work function.

The first and second gate electrodes BG1 and BG2 may respectively include a first electrode E1, a second electrode E2 and a third electrode E3. The first electrode E1 may extend in the second direction ②, and the second electrode E2 and the third electrode E3 may branching from the first electrode E1. The second electrode E2 and the third electrode E3 may extend in the first direction ①. The first electrode E1, the second electrode E2 and the third electrode E3 may surround at least three side surfaces of the first and second pillars P1 and P2. The first electrode E1 may be in a direction crossing with the buried bit line 114, and the second electrode E2 and the third electrode E3 may be positioned between neighboring first pillars P1 or between neighboring second pillars P2.

The gate trench 112 may be a line type extending in any one direction. The gate trench 112 may include a first trench T1, a second trench T2 and a third trench T3. The first electrode E1 may be formed in the first trench T1, and the second and third electrodes E2 and E3 may be formed in the second trench T2 and third trench T3, respectively.

Hereinafter, a second device isolation region I2 will be described in detail. The second device isolation region I2 may include a spacer 106, a shield pillar 105 and a second isolation dielectric layer 107. The second device isolation layer 12 may be formed in the second isolation trench 104. The second device isolation region I2 may have the shield pillar 105 therein. The shield pillar 105 may be formed of a silicon-containing material. The shield pillar 105 may include polysilicon layer. The shield pillar 105 may be doped with an impurity. The shield pillar 105 may include a polysilicon layer doped with boron. The shield pillar 105 may be independently positioned between the major axes of the active region 102I. That is, neighboring shield pillars 105 may be formed separately from each other.

The shield pillar 105 may be recessed such that the surface height thereof is lower than that of the top surface of the active region 102I. The spacer 106 may be positioned between the sidewall of the shield pillar 105 and the sidewall of the second isolation trench 104. The bottom of the shield pillar 105 may contact the substrate 100.

According to the first embodiment, the shield pillar 105 may be positioned between the major axes X2 of two active regions 102I. Thus, passing gate (PG) effect may be suppressed. That is, field shielding of the passing gate may result in suppressing PG effect. Moreover, since the shield pillar 105 functions as a back gate, threshold voltage may be increased.

Hereinafter, a method for manufacturing the semiconductor in accordance with the first embodiment will be described. For convenience, the description will be divided into three parts, which are production part 1, production part 2, and production part 3. The production part 1 relates to a method for forming parallel active regions, the production part 2 relates to a method for forming a buried bit line (BBL) and the production part 3 relates to a method for forming a buried gate electrode (BG).

FIGS. 3A to 3H are cross-sectional views illustrating an example of a method for forming parallel active regions of the semiconductor device in accordance with the first embodiment. FIGS. 4A to 4H are cross-sectional views taken along the lines A-A' and B'-B of FIG. 3A to 3H.

Figure 3A:
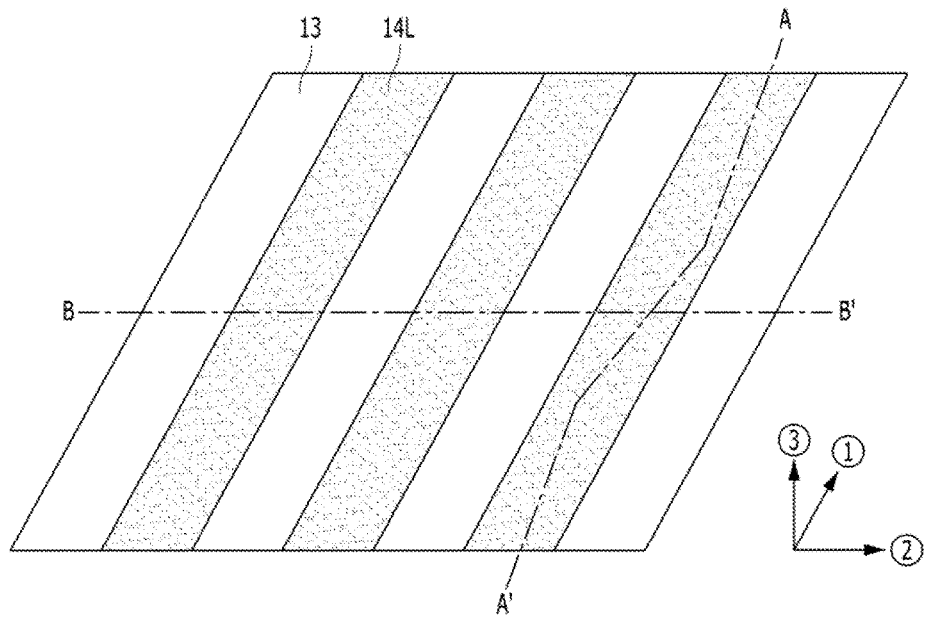
FIGS. 3A to 3H are views illustrating an example of a method for forming parallel active regions of the semiconductor device in accordance with the first embodiment.
Figure 4A:
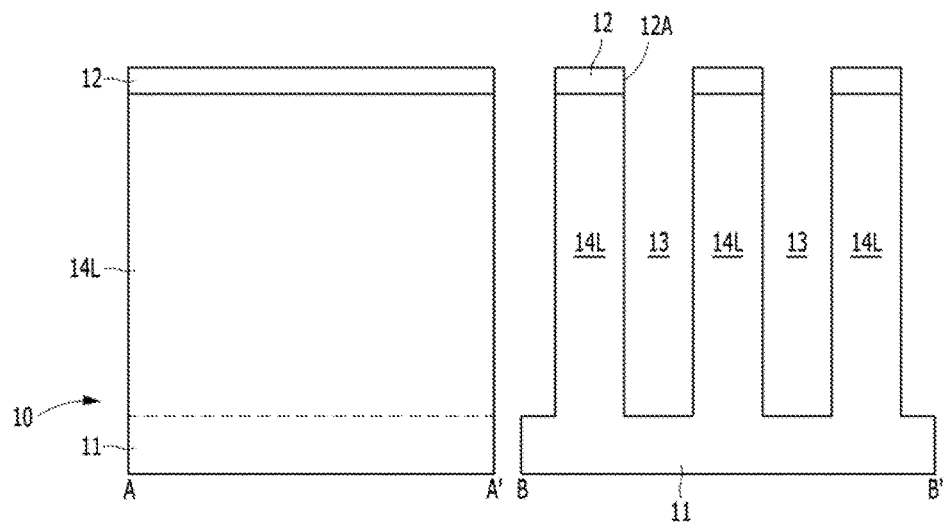
FIGS. 4A to 4H are cross-sectional views taken along the lines A-A' and B'-B of FIG. 3A to 3H.

As shown in FIGS. 3A and 4A, a substrate 10 may be prepared. The substrate 10 may include a material suitable for a semiconductor processing. The substrate 10 may include a semiconductor substrate. The substrate 10 may include a silicon-containing material. The substrate 10 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In another embodiment the substrate 10 may include semiconductor material such as germanium. Also, the substrate 10 may include III/V group semiconductor materials, for example, a compound semiconductor substrate such as GaAs. Further, the substrate 10 may include a silicon-on-insulator (SOI) substrate.

A first hard mask layer 12 may be formed on the substrate 10. A plurality of line type openings 12A may be formed in the first hard mask layer 12. To form the plurality of line type openings 12A, the first hard mask layer 12 may be etched by using a mask (not shown). The plurality of line type openings 12A may be formed by a spacer pattern technology (SPT). The first hard mask layer 12 may be formed of a material having etch selectivity with respect to the substrate 10. For example, the first hard mask layer 12 may include silicon nitride. Although it is not shown, a buffer layer or a pad layer may be formed between the first hard mask layer 12 and the substrate 10. The buffer layer may be formed of silicon oxide.

A first isolation trench 13 may be formed. The substrate 10 may be etched by using the first hard mask layer 12 having the line type opening 12A as an etch mask. Thus, the first isolation trench 13 may be formed in a line type. A line type active region 14L may be defined in the substrate 10 by the first isolation trench 13. A space between the line type active regions 14L may become the first isolation trench 13. The line type active region 14L and the first isolation trench 13 may extend in the first direction ①. For convenience, the first direction ① may also be referred to as an oblique direction. The bottom of the substrate 10 where the process for forming the line type active region 14L and the first isolation trench 13 are not performed is referred to as a bulk 11.

Figure 3B:
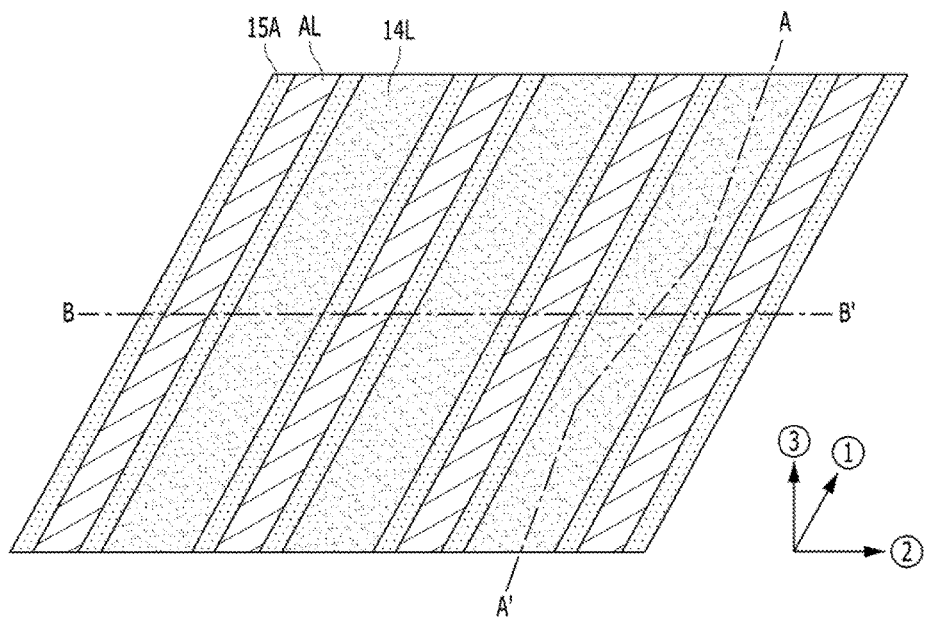
Figure 4B:
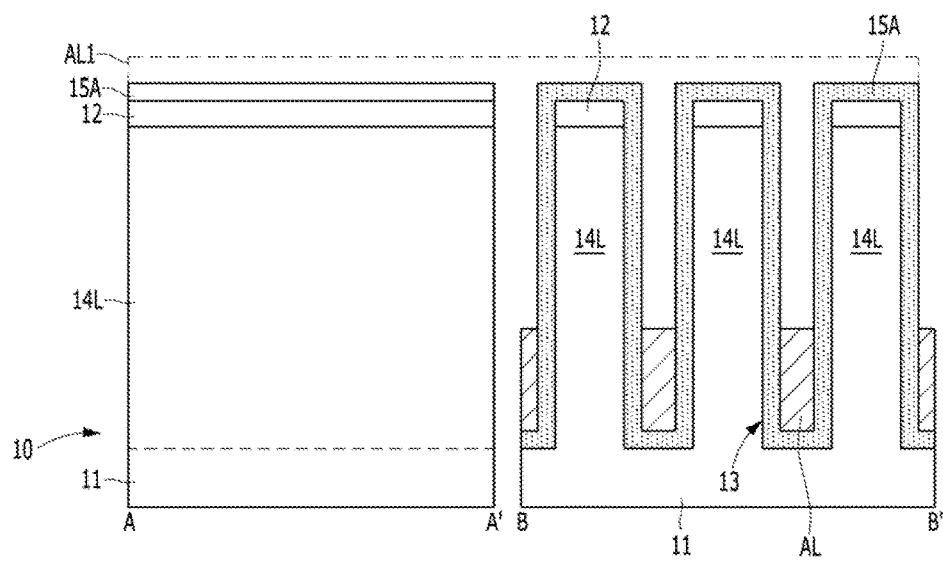

As shown in FIGS. 3B and 4B, a first liner layer 15A may be formed in the first isolation trench 13. The first liner layer 15A may be formed of silicon oxide. The first liner layer 15A may be formed by a thermal oxidation process or a deposition process. In another embodiment, the first liner layer 15A may be formed in a double layer structure. For example, the first liner layer 15A may be a stack of silicon oxide and silicon nitride.

A dielectric pillar layer AL1 may be formed on the first liner layer 15A. The dielectric pillar layer AL1 may be formed of a material having etch selectivity with respect to the first liner layer 15A. The dielectric pillar layer AL1 may include a silicon-containing material. The dielectric pillar layer AL1 may include silicon germanium (SiGe).

The dielectric pillar layer AL1 may be recessed. The dielectric pillar layer AL1 may be recessed in the first isolation trench 13 to form a dielectric pillar AL. The dielectric pillar AL may have a recessed surface. The recessed surface of the dielectric pillar AL may be lower than the top surface of the line type active region 14L.

Figure 3C:
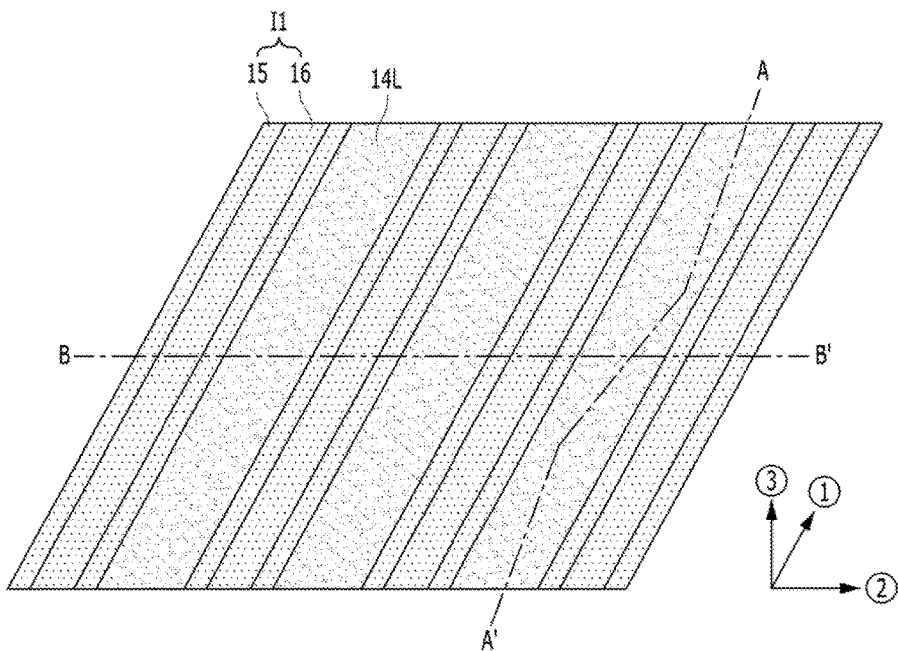
Figure 4C:
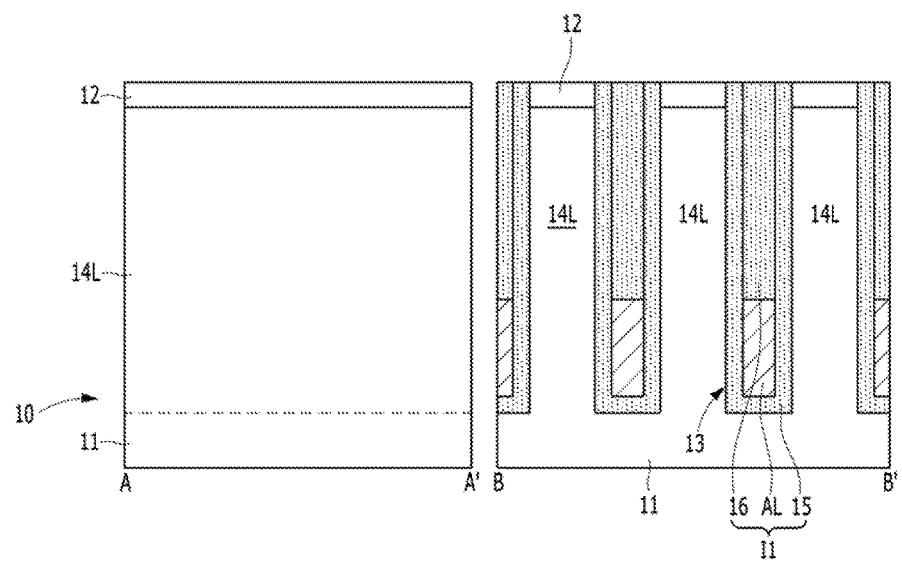

As shown in FIGS. 3C and 4C, a first isolation dielectric layer 16 may be formed on the dielectric pillar AL. The first isolation dielectric layer 16 may be formed of a dielectric material. The first isolation dielectric layer 16 may include silicon oxide, silicon nitride or a combination thereof. A chemical vapor deposition (CVD) process or another deposition process may be used to fill the first isolation trench 13 with the dielectric material. The first isolation dielectric layer 16 may include a spin-on-dielectric (SOD).

A planarization process such as chemical mechanical polishing (CMP) may be performed with respect to the first isolation dielectric layer 16. Thus, the first isolation dielectric layer 16 filling the first isolation trench 13 may be formed. In the planarization process of the first isolation dielectric layer 16, a part of the first liner layer 15A may be planarized. For example, the first isolation dielectric layer 16 and the first liner layer 15A may be planarized until the top surface of the first hard mask layer 12 is exposed. Thus, the first isolation dielectric layer 16 and a first liner 15 may remain in the first isolation trench 13.

According to the above processes, a first device isolation region I1 may be formed. The first device isolation region I1 may include the first liner 15, the dielectric pillar AL and the first isolation dielectric layer 16. The first device isolation region I1 may be formed in the first isolation trench 13. The dielectric pillar AL may be formed in the first device isolation region I1. The line type active region 14L and the first device isolation region I1 may be alternately formed. The line width of the line type active region 14L may be the same as that of the first device isolation region I1. The line type active region 14L and the first device isolation region I1 may extend in the first direction ①.

Figure 3D:
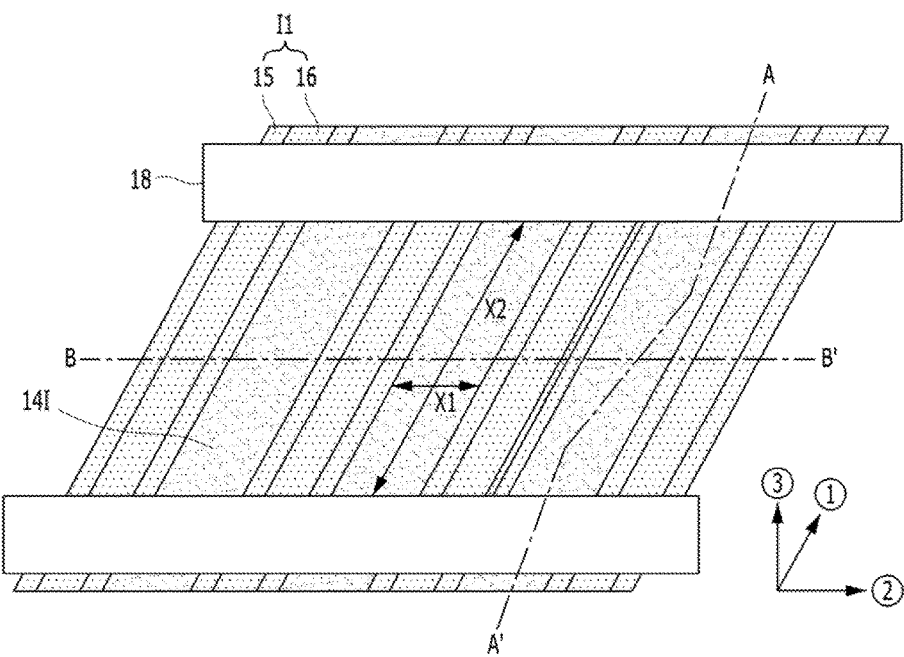
Figure 4D:
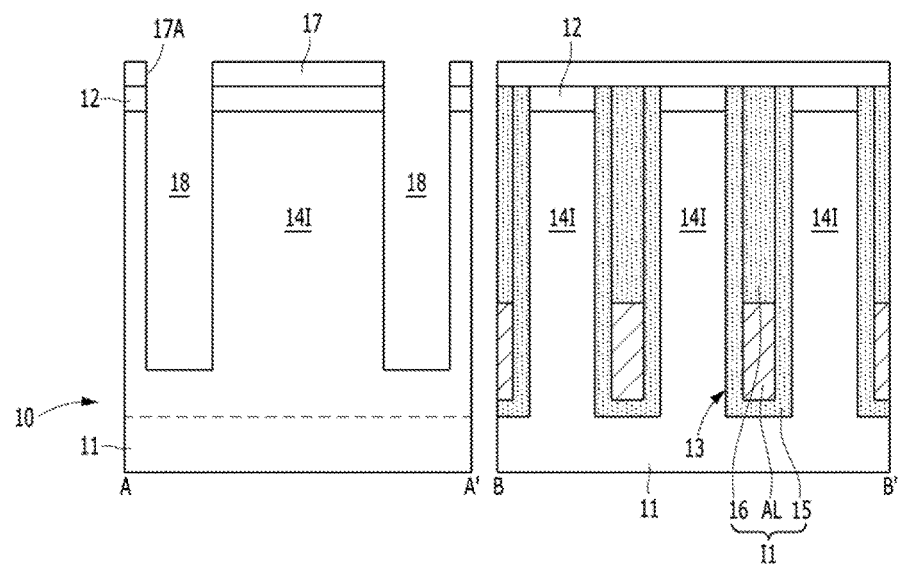

As shown in FIGS. 3D and 4D, the line type active region 14L may be cut in a uniform length unit. To cut the line type active region 14L, a cutting mask 17 may be used. The cutting mask 17 may have a plurality of line type openings 17A. The plurality of line type openings 17A may extend in the second direction ②. The cutting mask 17 may extend in a direction crossing with the line type active region 14L. The cutting mask 17 may include a photoresist pattern.

The first hard mask layer 12, the line type active region 14L and the first device isolation region I1 may be etched by using the cutting mask 17 as an etch mask. Thus, the line type active region 14L may be cut to form a second isolation trench 18. The second isolation trench 18 may extend in the second direction ②. A plurality of island type active regions 14I may be formed by the second isolation trench 18.

According to the above processes, the line type active region 14L may be cut to form the independent island type active region 14I. When viewed in the first direction ①, neighboring island type active regions 14I may be uniform in length and spacing and may be separated from each other by the second isolation trench 18.

The island type active region 14I may have a minor axis X1 and a major axis X2. The plurality of island type active regions 14I may be repeatedly formed and spaced from each other along the first direction ① and the second direction ②. The second isolation trench 18 may be formed between the major axes X2 of neighboring island type active regions 14I, and the first device isolation region I1 may be positioned between the minor axes X1 of neighboring island type active regions 14I. The second isolation trench 18 may extend in the second direction ②.

Figure 3E:
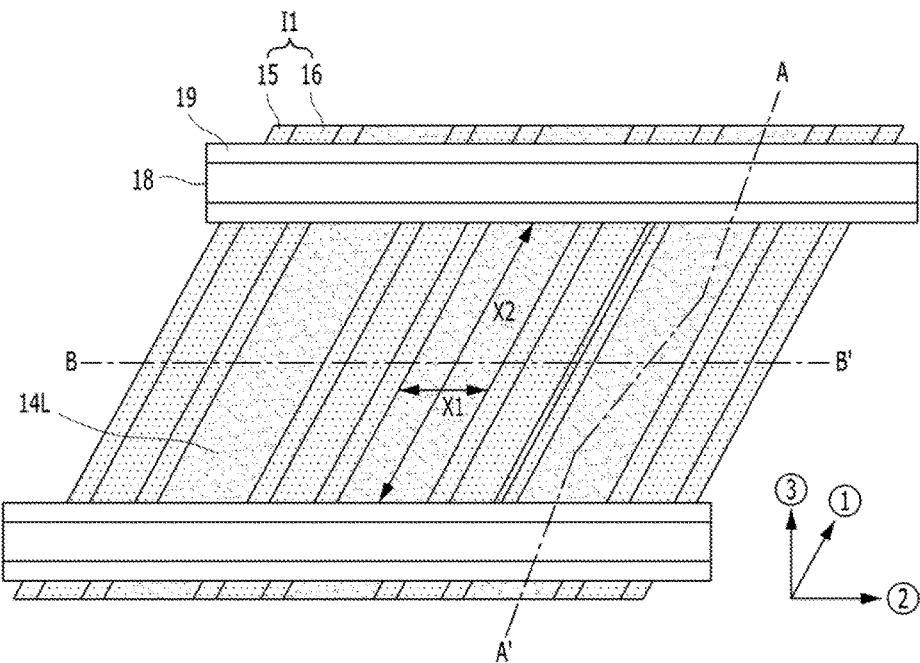
Figure 4E:
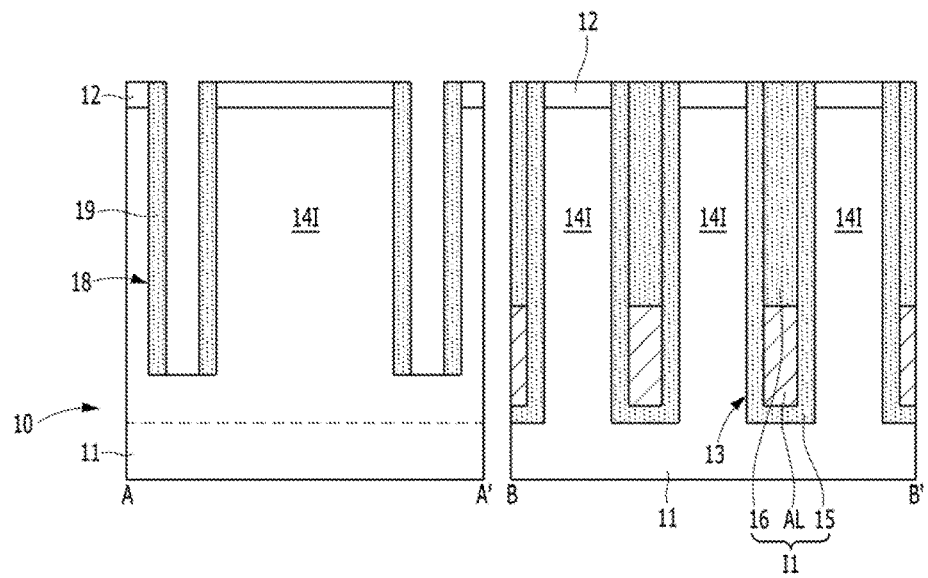

As shown in FIGS. 3E and 4E, the cutting mask 17 may be removed. A spacer 19 may be formed on the sidewalls of the second isolation trench 18. To form the spacer 19, a dielectric material may be deposited followed by an etch-back process. The spacer 19 may be formed of a material having etch selectivity with respect to the substrate 10. The spacer 19 may include silicon oxide. The bottom surface of the second isolation trench 18 may be exposed by the spacer 19.

Figure 3F:
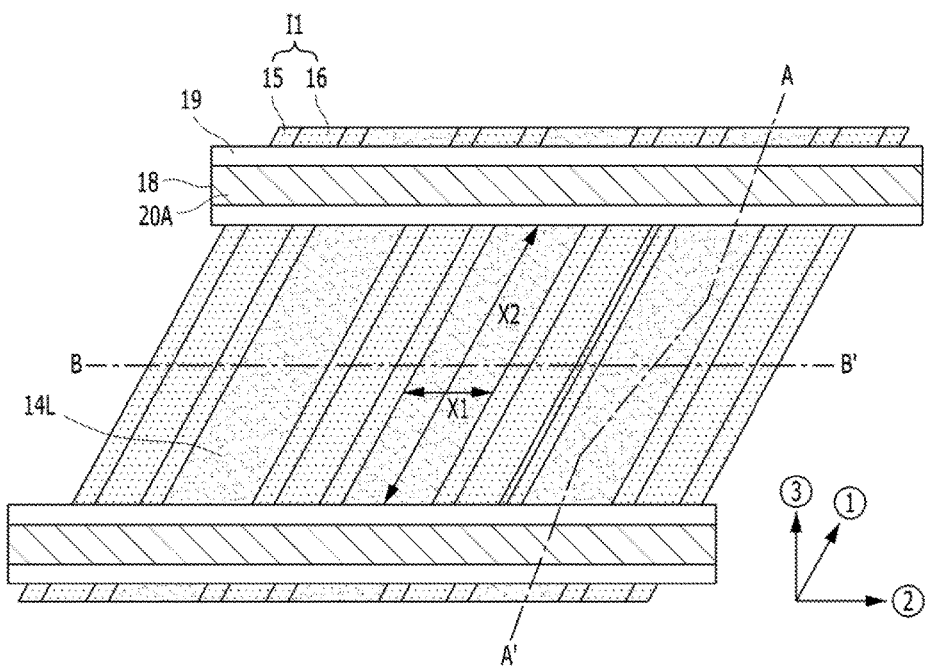
Figure 4F:
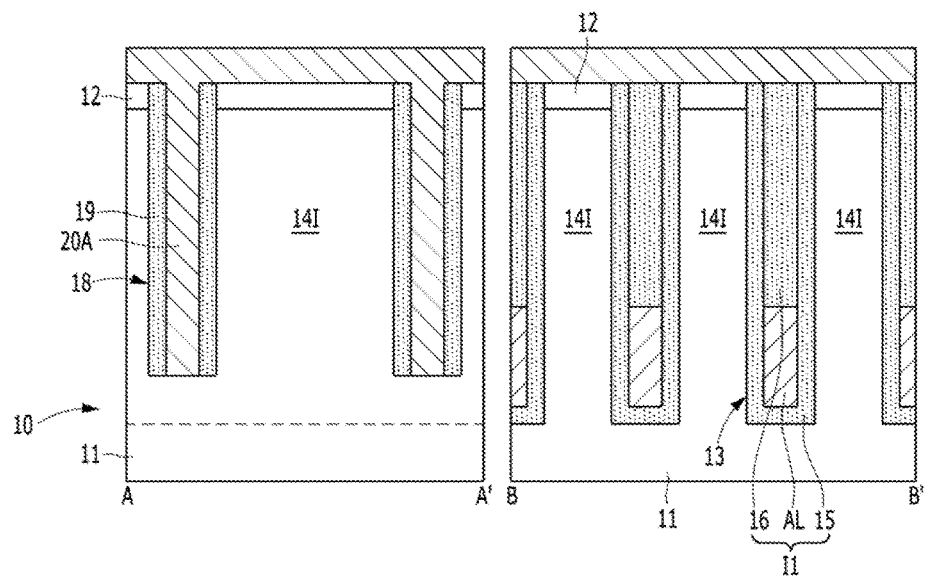

As shown in FIGS. 3F and 4F, a shield layer 20A may be formed. The shield layer 20A may include a conductive material. The shield layer 20A may be formed of a silicon-containing material. The shield layer 20A may include a polysilicon layer. The shield layer 20A may be doped with an impurity to have conductivity. The shield layer 20A may include a polysilicon layer doped with boron.

Figure 3G:
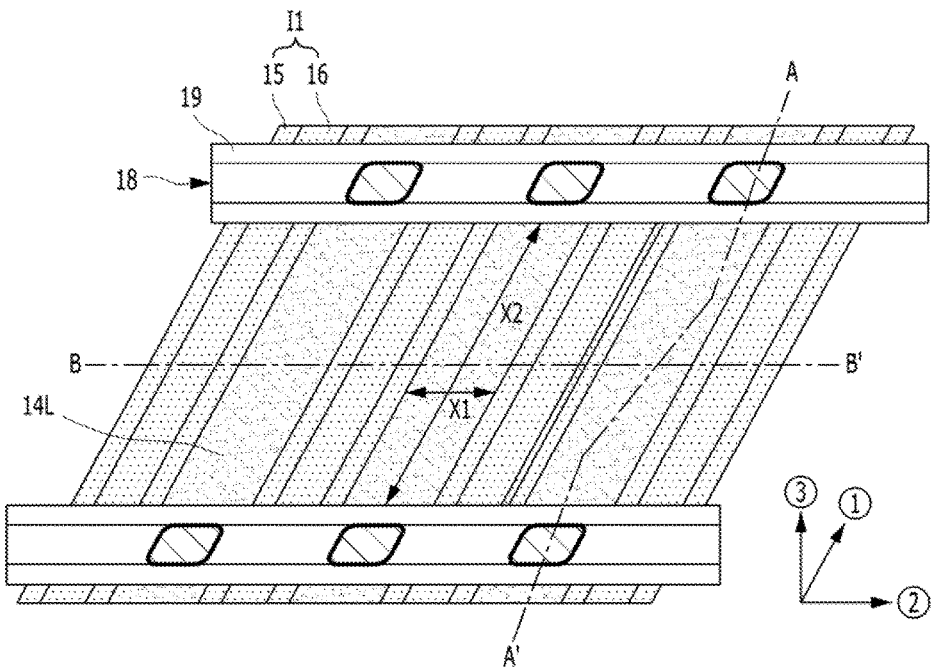
Figure 4G:
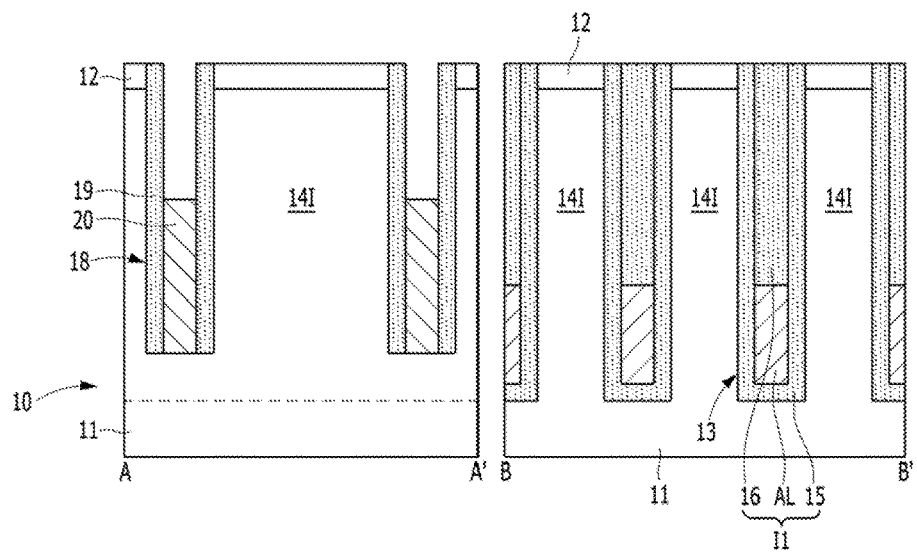

As shown in FIGS. 3G and 4G, a shield pillar 20 may be formed. The shield pillar 20 may be formed by selectively etching the shield layer 20A. For example, the shield layer 20A may be etched by an etch-back process. Thus, the shield pillar 20 may be formed in the second isolation trench 18. The shield pillar 20 may be independently positioned between the major axes of the active regions 14I. That is, neighboring shield pillars 20 may be formed separately from each other. The shield pillar 20 may be recessed such that the surface height thereof is lower than that of the top surface of the active region 14I. The spacer 19 may be formed between a sidewall of the shield pillar 20 and a sidewall of the second isolation trench 18. The bottom of the shield pillar 20 may contact the substrate 10.

Figure 3H:
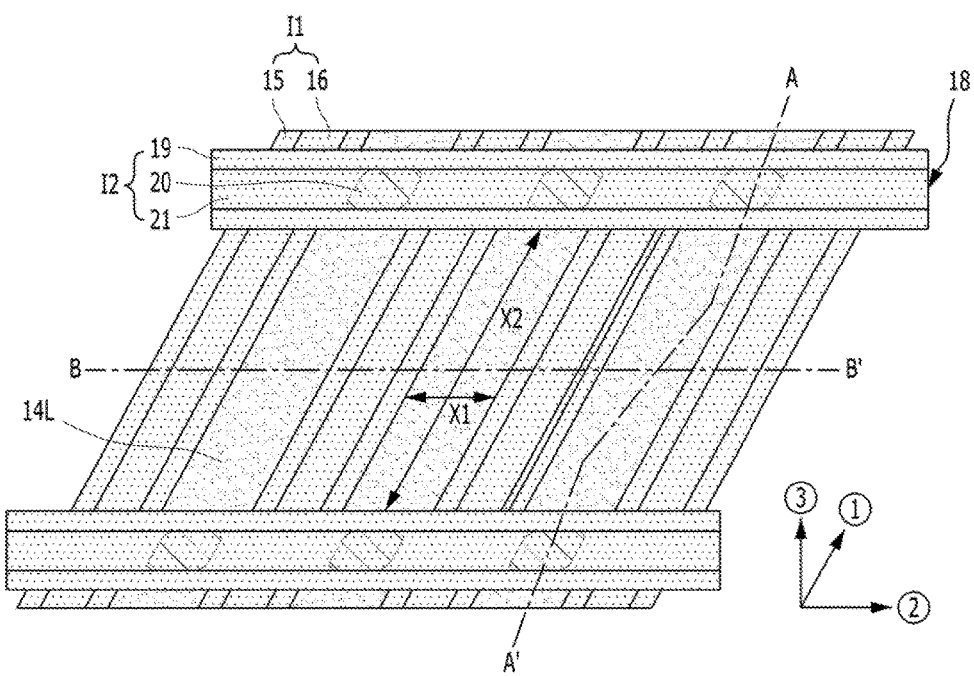
Figure 4H:
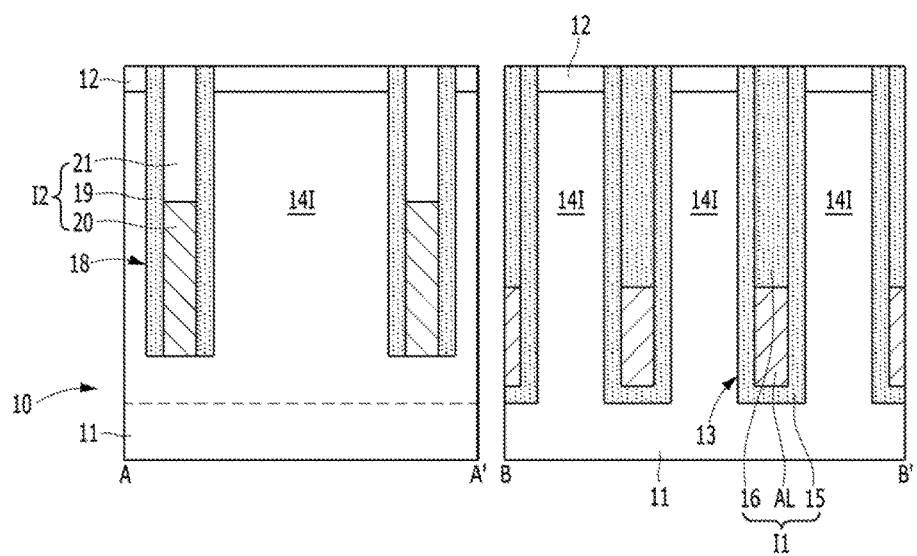

As shown in FIGS. 3H and 4H, a second isolation dielectric layer 21 may be formed. The second isolation dielectric layer 21 may be formed of silicon oxide. The second isolation dielectric layer 21 may fill the recessed region of the shield pillar 20. Subsequently, the second isolation dielectric layer 21 may be planarized. Thus, the second isolation dielectric layer 21 may remain to fill the recessed region of the shield pillar 20. The planarized surface of the second isolation dielectric layer 21 may be at the same level as the top surface of the first hard mask layer 12.

As above, a second device isolation region I2 may be formed by planarizing the second isolation dielectric layer 21. The second device isolation region I2 may include the spacer 19, the shield pillar 20 and the second isolation dielectric layer 21. The second device isolation region I2 may be formed in the second isolation trench 18. The second device isolation region I2 may have the shield pillar 20.

The island type active region 14I may be defined by the first device isolation region I1 and the second device isolation region I2. A plurality of island type active regions 14I may be defined by a plurality of first device isolation regions I1 and a plurality of second device isolation regions I2. The plurality of island type active regions 14I may be disposed in parallel with each other. It may be referred to as parallel active regions.

The shield pillar 20 may be positioned between major axes of the island type active regions 14I. Thus, PG effect may be suppressed.

FIGS. 5A to 5H are views illustrating an example of a method for forming a buried bit line of the semiconductor in accordance with the first embodiment. FIGS. 6A to 6H are cross-sectional views taken along the lines A-A, B-B' and C-C' of FIG. 5A to 5H. Hereinafter, for convenience, in FIGS. 5A to 5H, the first device isolation region I1 and the second device isolation region I2 are shown. That is, the first liner 15, the dielectric pillar AL, the spacer 19 and the second isolation dielectric layer 21 are omitted. However, the shield pillar 20 formed in the second device isolation region I2 is shown.

Figure 5A:
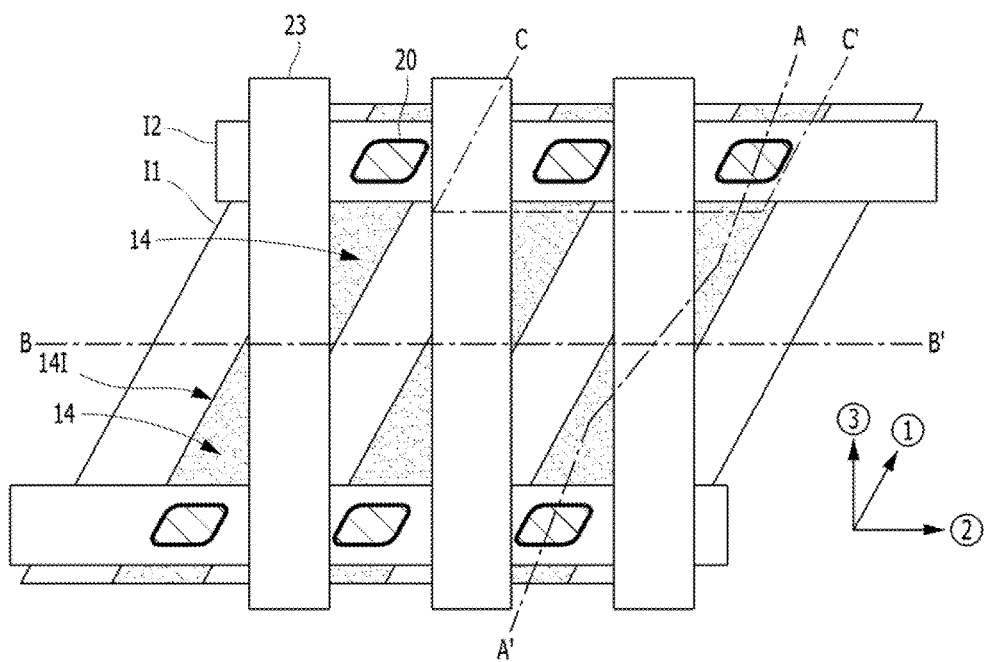
FIGS. 5A to 5H are views illustrating an example of a method for forming a buried bit line of the semiconductor in accordance with the first embodiment.
Figure 6A:
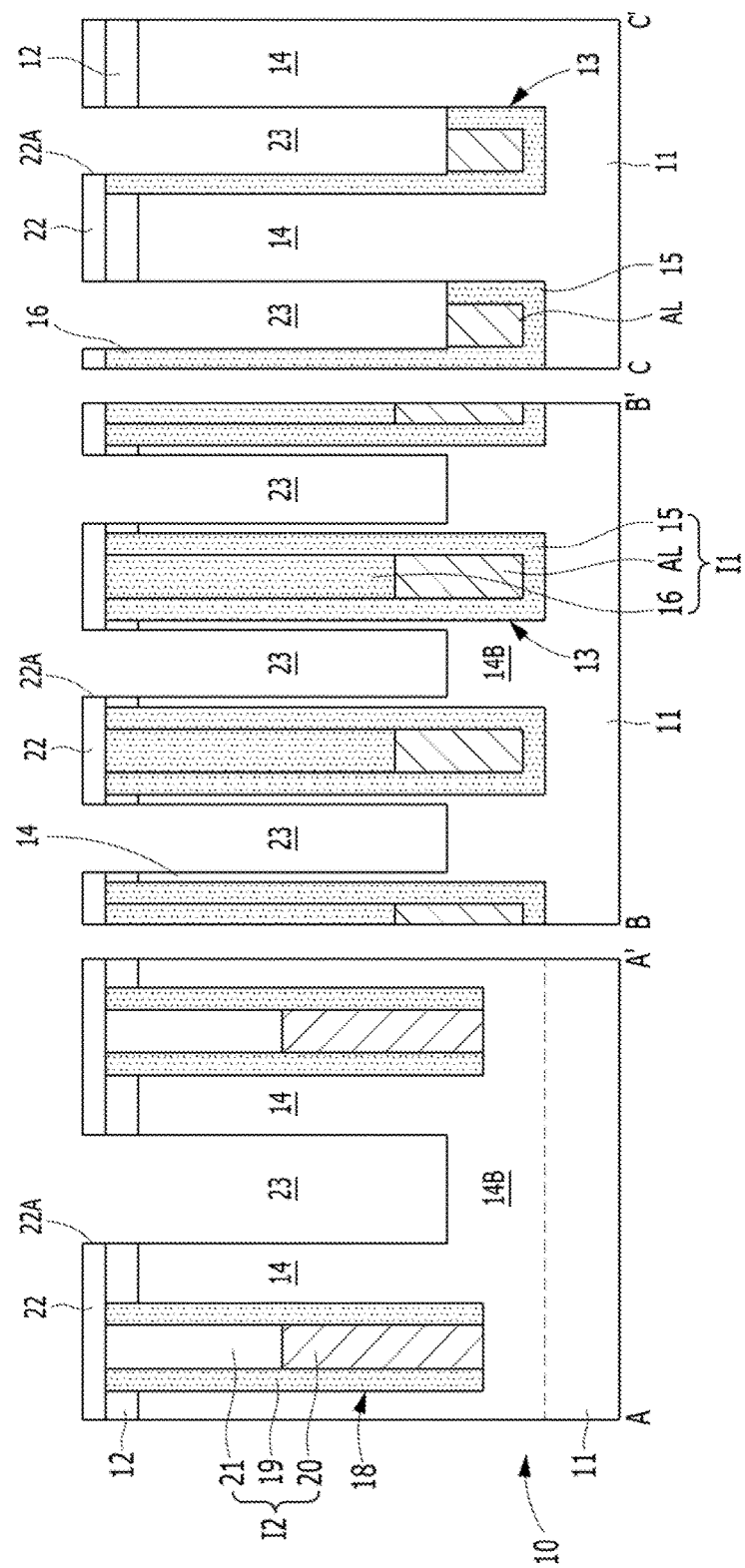
FIGS. 6A to 6H are cross-sectional views taken along the lines A-A', B-B' and C-C' of FIG. 5A to 5H.

As shown in FIGS. 5A and 6A, a second hard mask layer 22 may be formed. A plurality of line type openings 22A may be formed in the second hard mask layer 22. The second hard mask layer 22 may be formed of a material having etch selectivity with respect to the substrate 10. For example, the second hard mask layer 22 may include silicon nitride.

A bit line trench 23 may be formed. The island type active region 14I may be etched using the second hard mask layer 22 having the line type openings as an etch mask. Thus, the line type bit line trench 23 may be formed. The bit line trench 23 may be a line type extending in a third direction ③. The line trench 23 may extend in a direction crossing with the second isolation trench 18. The bit line trench 23 may be formed to be shallower than the first and second isolation trenches 13 and 18. The bit line trench 23 may have a depth sufficient to increase the average cross-sectional area of a subsequent gate electrode.

To form the bit line trench 23, in addition to the island type active region 14I, the first device isolation region I1 and the second device isolation region I2 may also be etched. A part of island type active region 14I may be divided into preliminary pillars 14 by the bit line trench 23. A remaining portion 14B of the island type active region 14I may be formed under the preliminary pillar 14. The remaining portion 14B may be referred to as a body 14B.

Figure 5B:
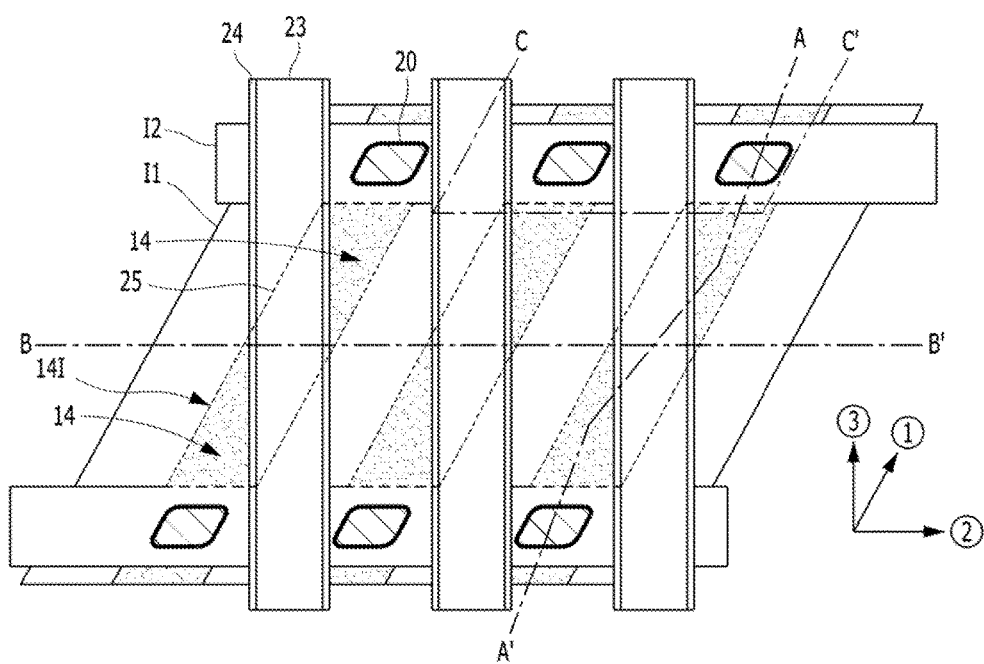
Figure 6B:
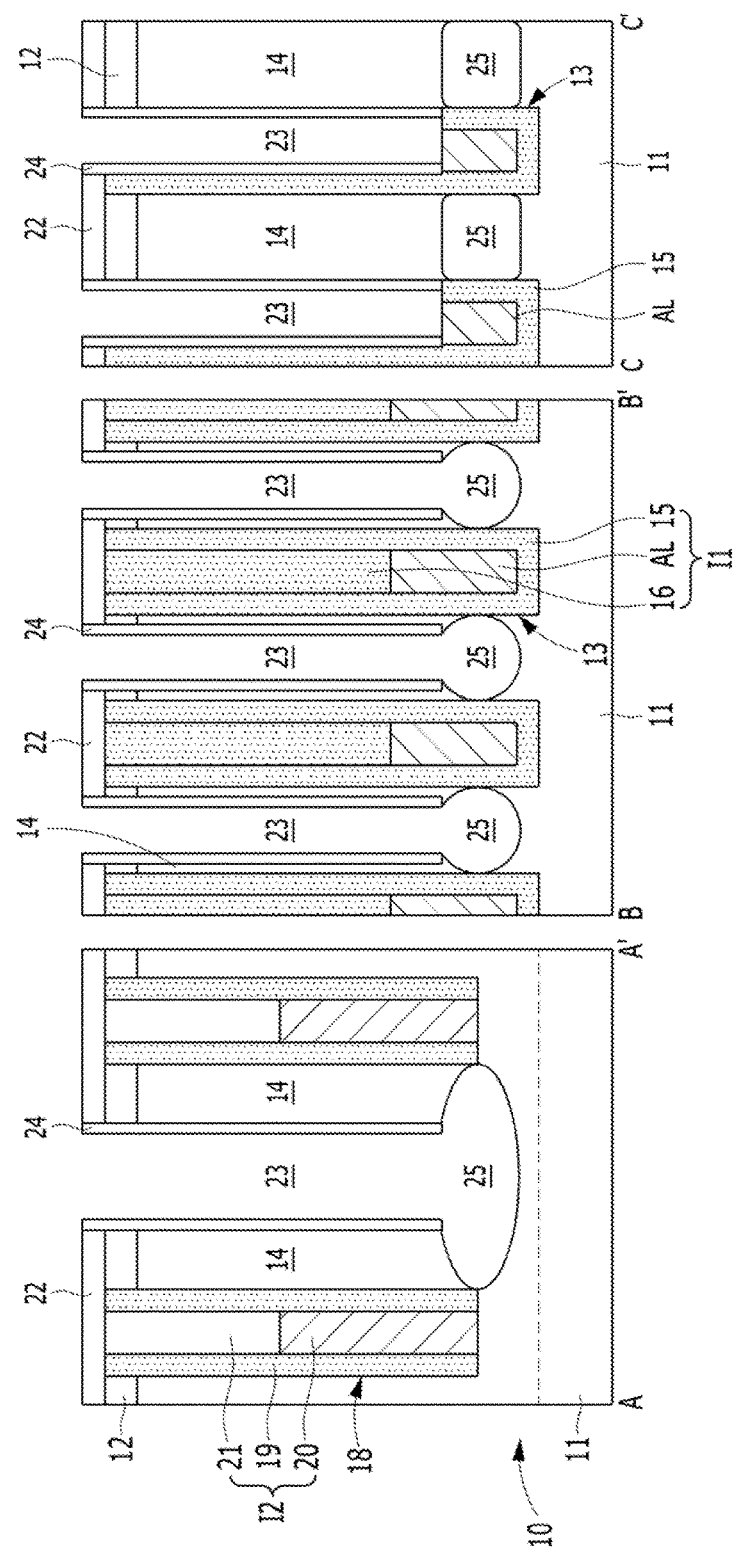

As shown in FIGS. 5B and 6B, a liner spacer 24 may be formed. The liner spacer 24 may be formed on both sidewalls of the bit line trench 23. The liner spacer 24 may be formed by depositing silicon oxide followed by an etch-back process.

A body trench 25 may be formed. The body trench 25 may be formed by etching the bottom surface of the bit line trench 23 to a given depth. The bottom surface of the bit line trench 23 may be extended by using the second hard mask layer 22 and the liner spacer 24 as etch masks. Thus, a part of the body 14B may be etched to form the body trench 25.

To form the body trench 25, isotropic etching may be performed. According to the isotropic etching, the body trench 25 may be a bulb type. The line width of the body trench 25 may be larger than that of the bit line trench 23. The depth of the body trench 25 may be shallower than those of the first and second isolation trenches 13 and 18. The body trench 25 may extend in the first direction ① under the preliminary pillar 14. For example, the side surface of the body trench 25 may be extended to be adjacent to the sidewalls of the second isolation trench 18.

When the bit line trench 23 and the body trench 25 are formed, the island type active region 14I may be divided into a pair of preliminary pillars 14. That is, the pair of preliminary pillars 14 may be spaced apart from each other by the bit line trench 23 and the body trench 25.

Figure 5C:
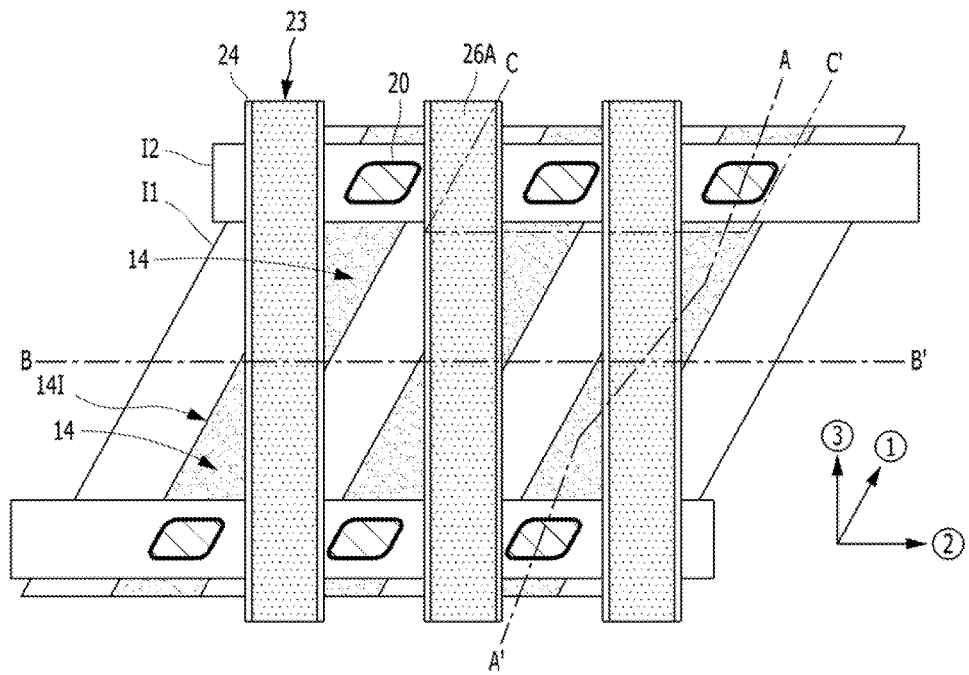
Figure 6C:
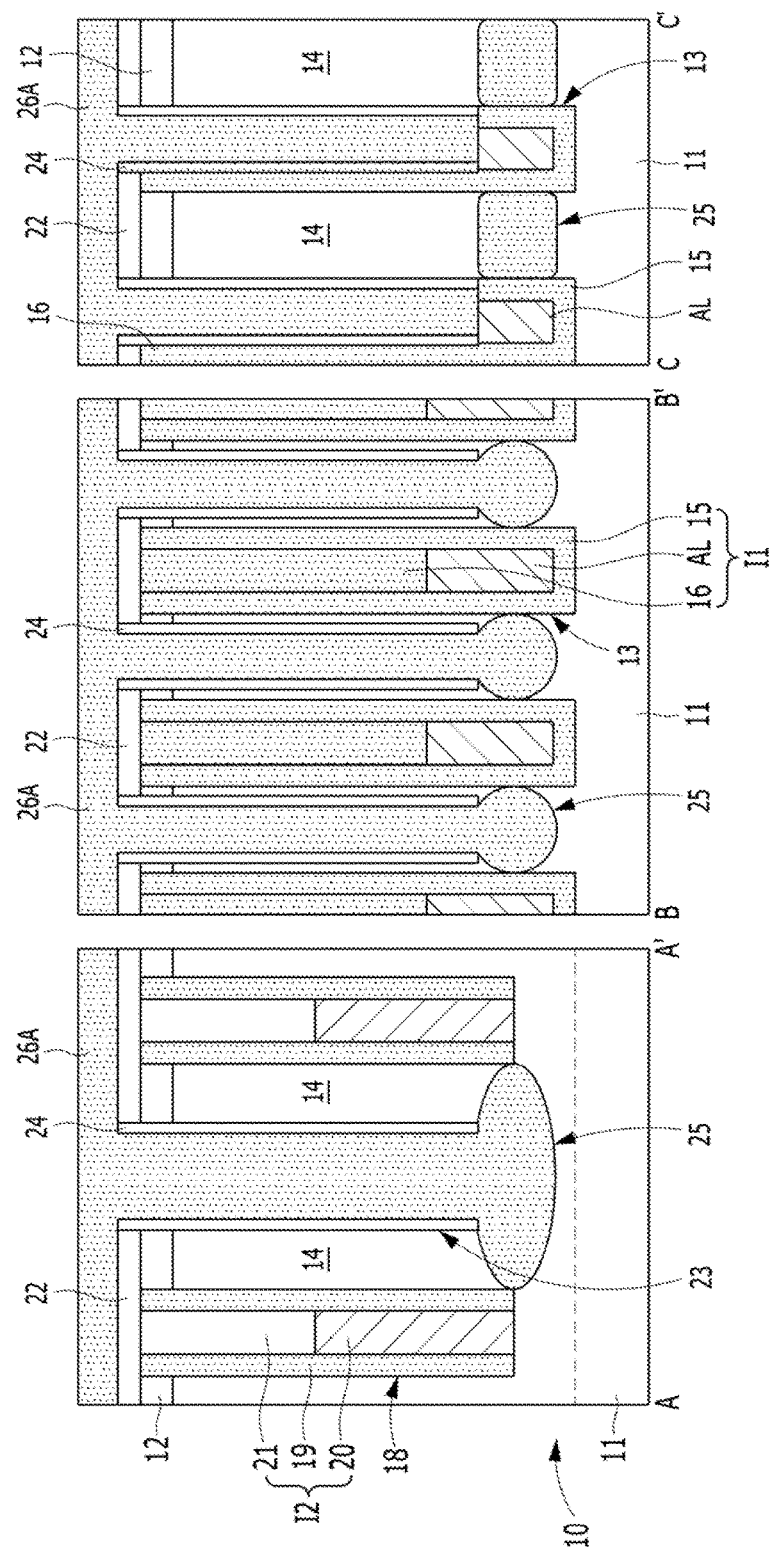

As shown in FIGS. 5C and 6C, a preliminary punch-through preventing layer 26A may fill the body trench 25 and the bit line trench 23. The preliminary punch-through preventing layer 26A may be formed of a dielectric material. To form the preliminary punch-through preventing layer 26A, the bit line trench 23 and the body trench 25 may be filled with a spin-on-dielectric (SOD).

Figure 5D:
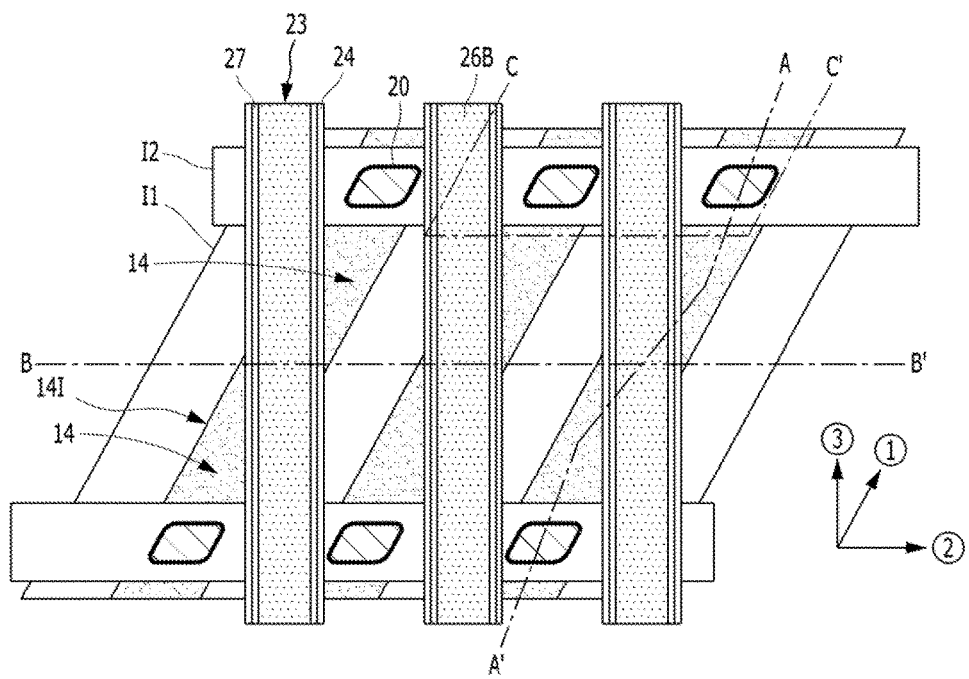
Figure 6D:
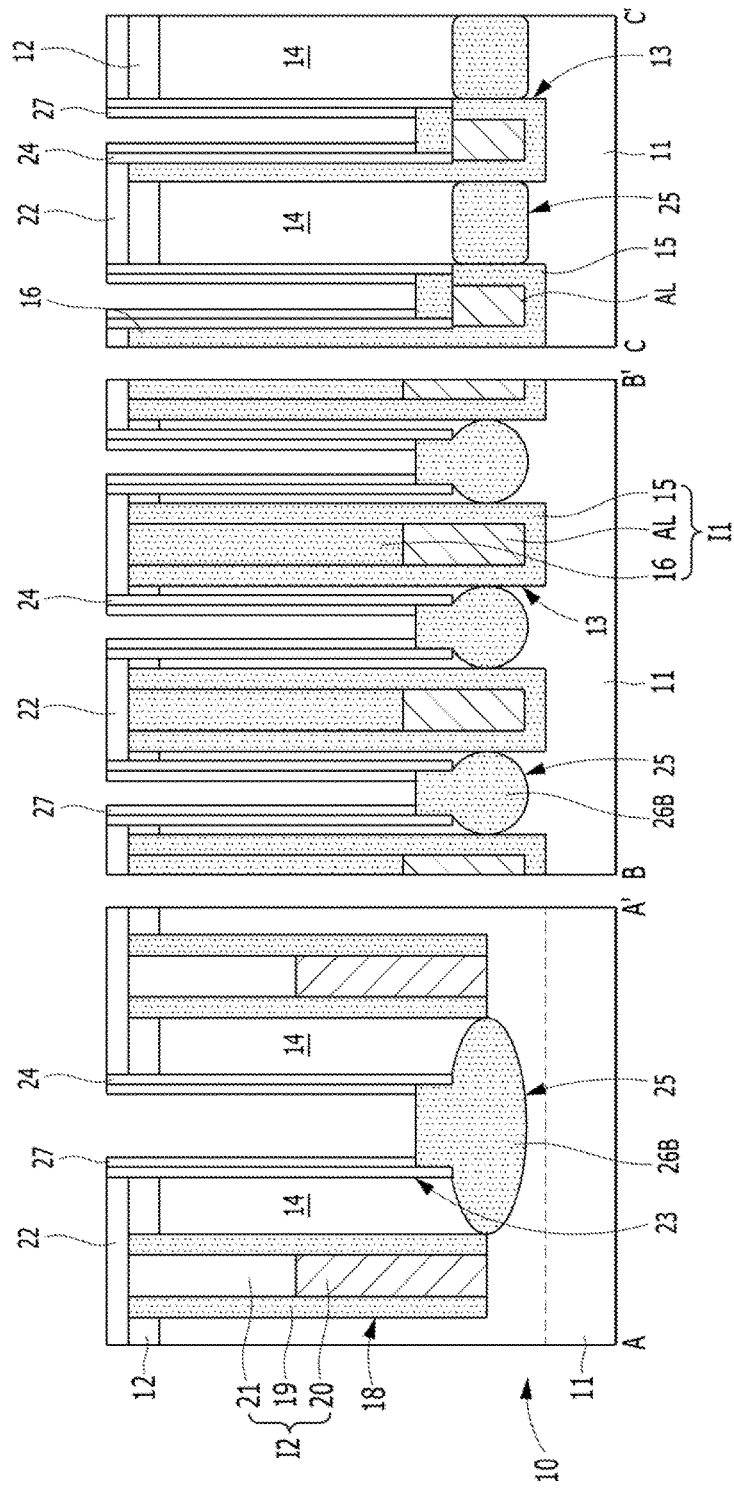

As shown in FIGS. 5D and 6D, a recessed punch-through preventing layer 26B may be formed. For example, the preliminary punch-through preventing layer 26A may be recessed to a given depth. The recessed punch-through preventing layer 26B may fill at least the body trench 25. A portion of the recessed punch-through preventing layer 26B is positioned at the bottom of the bit line trench 23. The pair of preliminary pillars 14 may float from the bulk 11 by the recessed punch-through preventing layer 26B. Moreover, electrical connection between the pair of the preliminary pillars 14 may be suppressed by the recessed punch-through preventing layer 26B. To form the recessed punch-through preventing layer 26B, a planarization process and then an etch-back process may be performed.

Then, a sacrificial spacer 27 may be formed. The sacrificial spacer 27 may cover the sidewalls of the liner spacer 24. The sacrificial spacer 27 may be formed of titanium nitride. For example, the sacrificial spacer 27 may be formed by conformally depositing titanium nitride followed by an etch-back process.

Figure 5E:
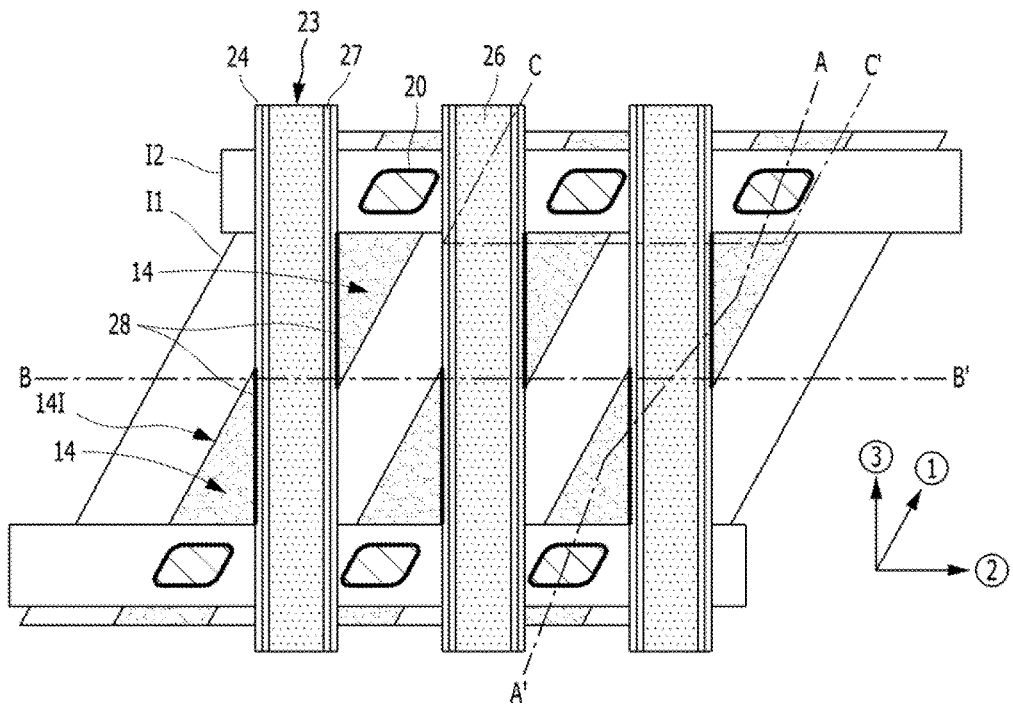
Figure 6E:
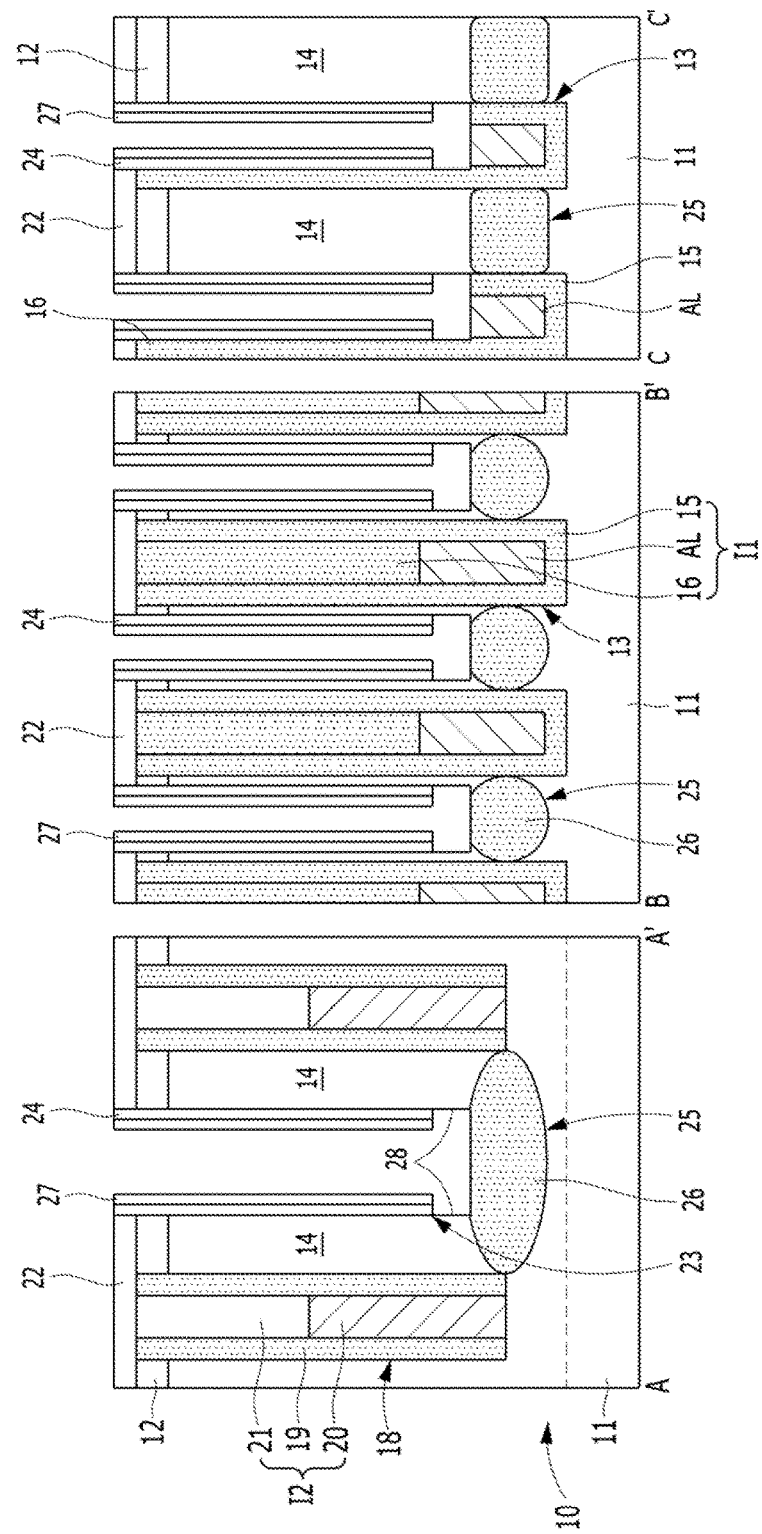

As shown in FIGS. 5E and 6E, an opening 28 exposing the bottom sidewall of the preliminary pillar 14 may be formed. To form the opening 28, the recessed punch-through preventing layer 26B may be recessed to a given depth by using the sacrificial spacer 27 as a barrier. Thus, a punch-through preventing layer 26 may be formed. The punch-through preventing layer 26 may fill the body trench 25. As the punch-through preventing layer 26 is recessed, a part of the liner spacer 24 may be exposed. Then, the exposed portion of the liner spacer 24 may be selectively removed.

Thus, the opening 28 exposing the bottom sidewall of the preliminary pillar 14 may be formed. The opening 28 is a region contacting a subsequent buried bit line and may be both side contact (BSC) exposing bottom sidewalls of neighboring preliminary pillars 14 simultaneously. For example, both bottom sidewalls of the bit line trench 23 may be simultaneously exposed by the opening 28. The upper sidewalls of the preliminary pillar 14 which are not exposed by the opening 28 may be covered by the liner spacer 24. Thus, this embodiment does not require additional contact masks for forming the opening 28.

Figure 5F:
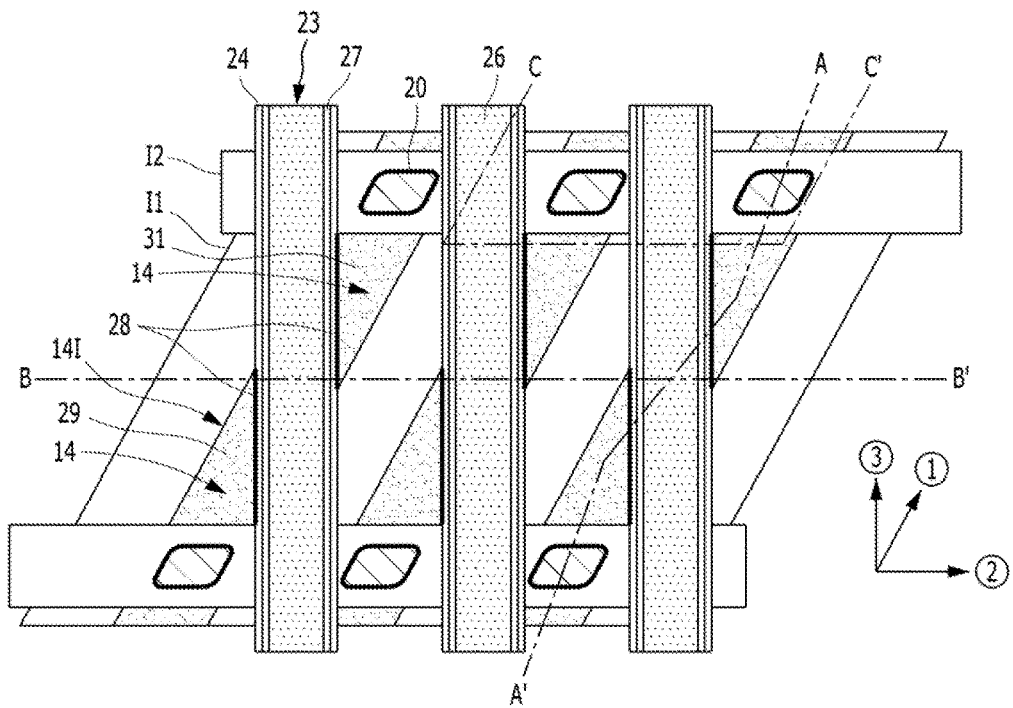
Figure 6F:
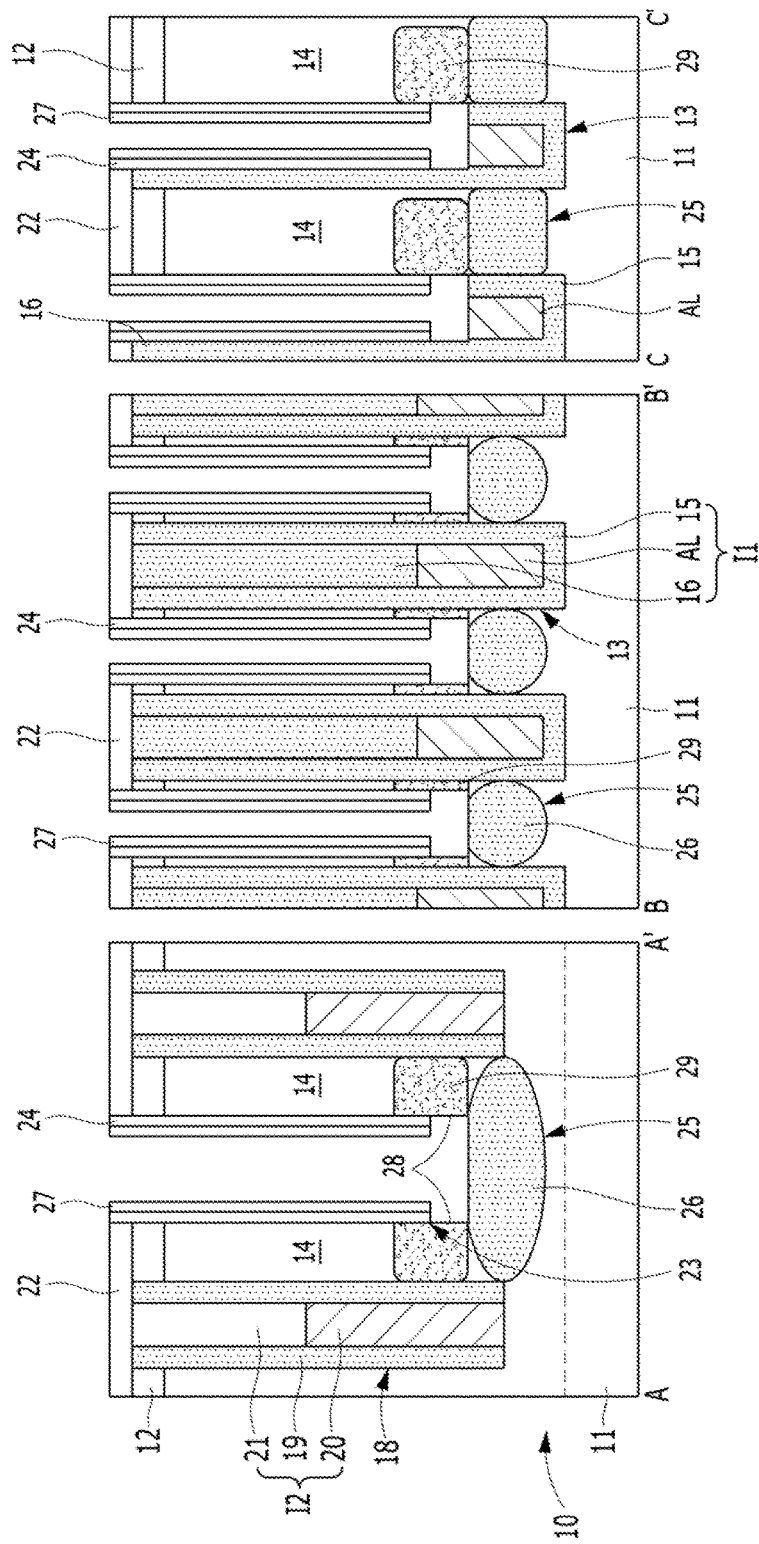

As shown in FIGS. 5F and 6F, a first junction region 29 may be formed. To form the first junction region 29, an impurity doping process may be performed by a plasma doping technology. For example, the impurity may be plasma doped through the opening 28 to form the first junction region 29. In the doping process, the impurity may include an N-type impurity or a P-type impurity. For example, phosphorous (P) or arsenic (As) may be used as the impurity. The first junction region 29 may be formed at the bottom of the preliminary pillar 14. The first junction region 29 may be formed floating from the bulk 11. That is, it may be separated from the bulk 11 by the punch-through preventing layer 26. Moreover, lateral diffusion of the first junction region 29 may be suppressed by the second device isolation region I2.

Figure 5G:
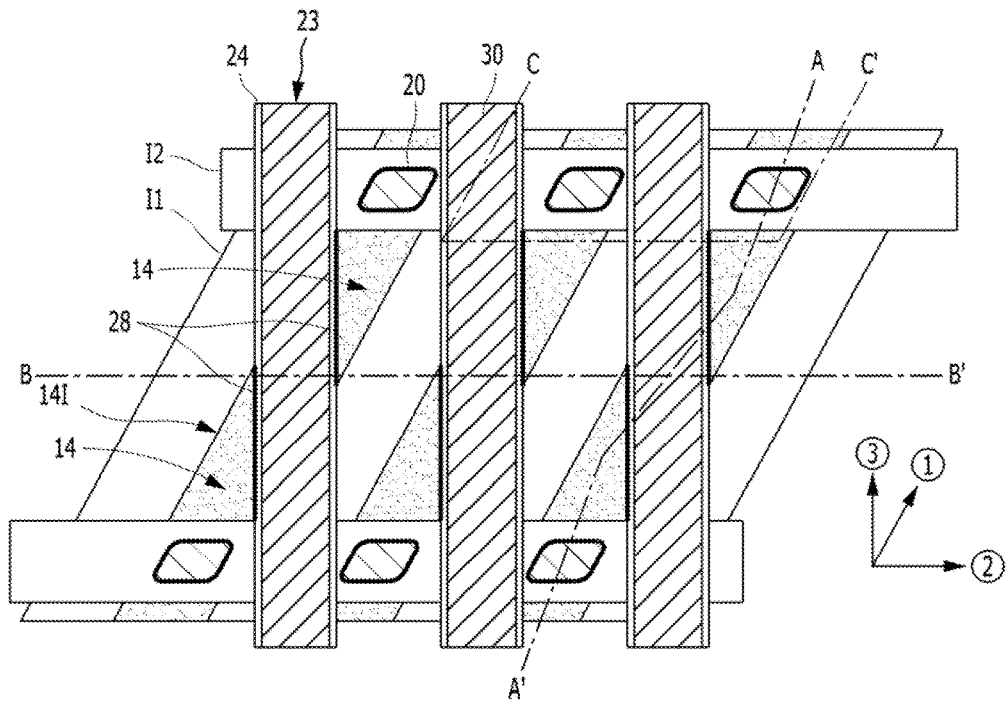
Figure 6G:
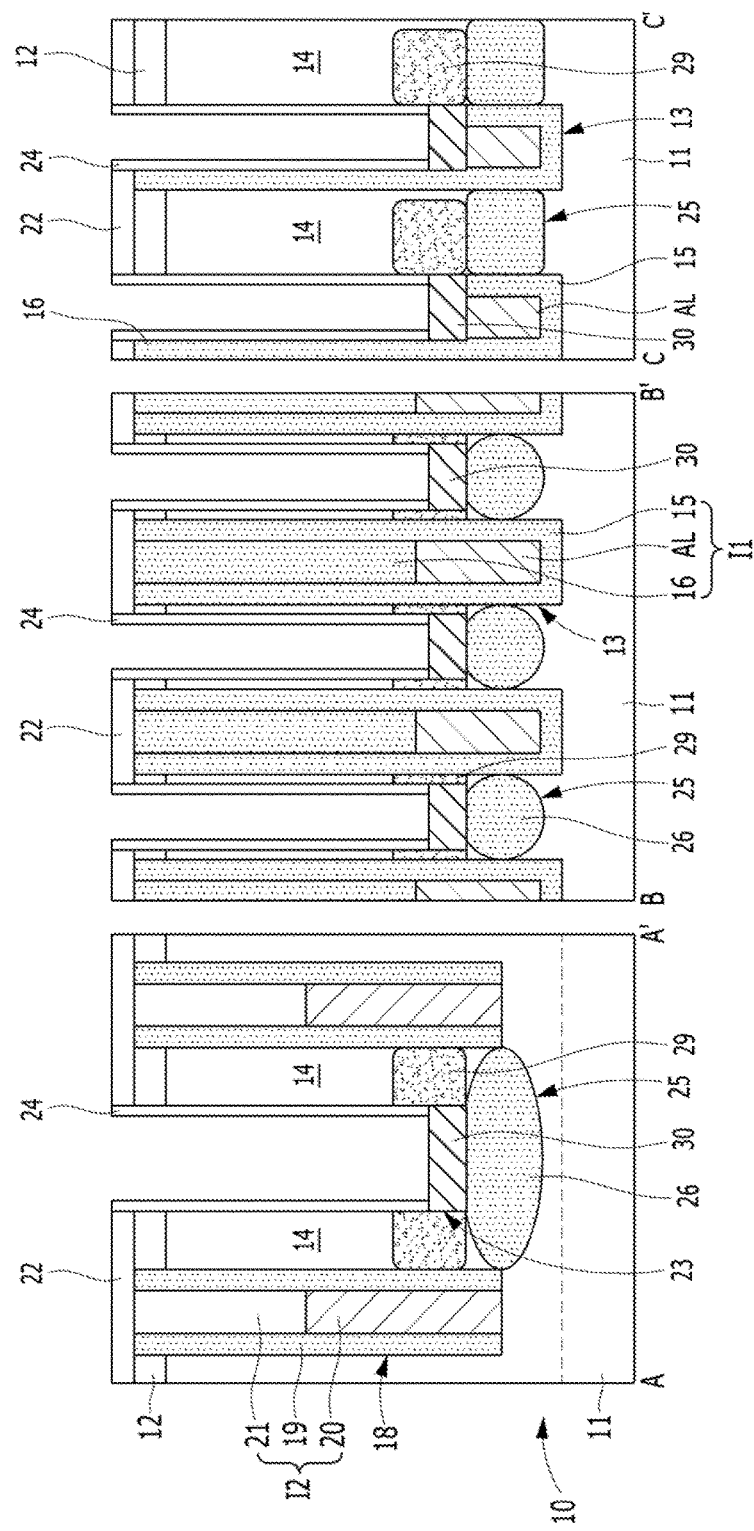

As shown in FIGS. 5G and 6G, a bit line 30 may be formed. For example, the bit line 30 may be formed by forming a metal layer (not shown) to bury the bit line trench 23 and then etching back the metal layer. Here, the bit line 30 may include tungsten (W). Both ends of the bit line 30 may be electrically coupled to the first junction region 29 by filling the opening 28. The punch-through preventing layer 26 may be positioned between the bit line 30 and the bulk 11.

Before forming the bit line 30, an ohmic contact layer (not shown) for an ohmic contact between the first junction region 29 and the bit line 30 may be formed. The ohmic contact layer may include metal silicide. For example, the ohmic contact layer may include cobalt silicide. To form cobalt silicide, a cobalt layer may be deposited on the whole surface of the structure having the first junction region 29 and then a thermal treatment may be performed. Subsequently, an unreacted cobalt layer may be removed.

As described above, the bit line 30 may contact the first junction region 29 without a plug. It may be referred to as a plugless contact.

Figure 5H:
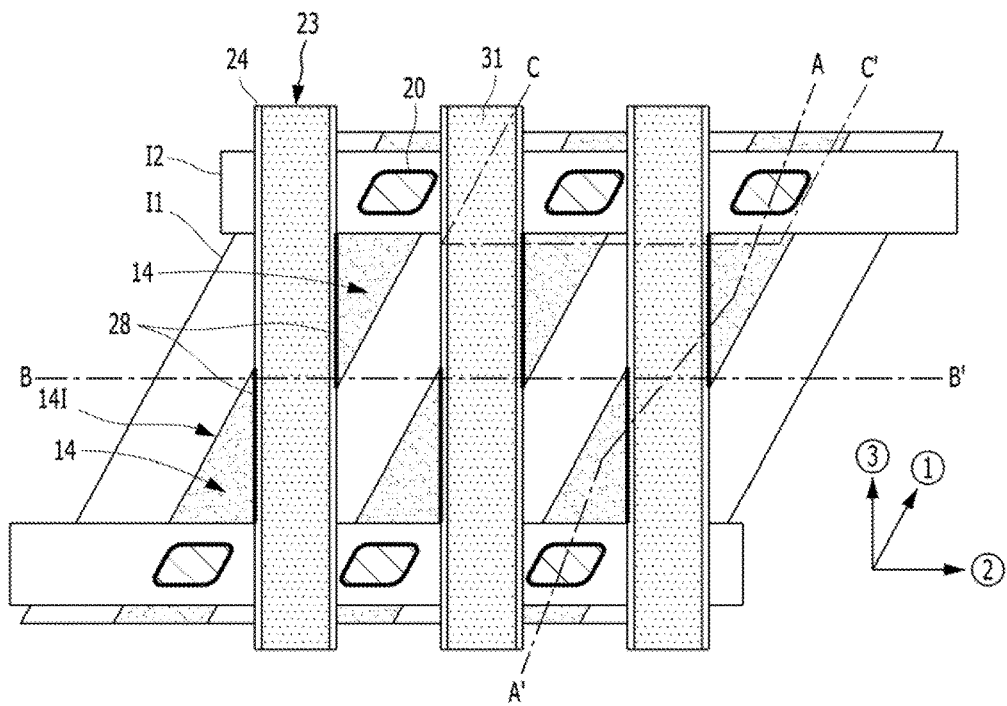
Figure 6H:
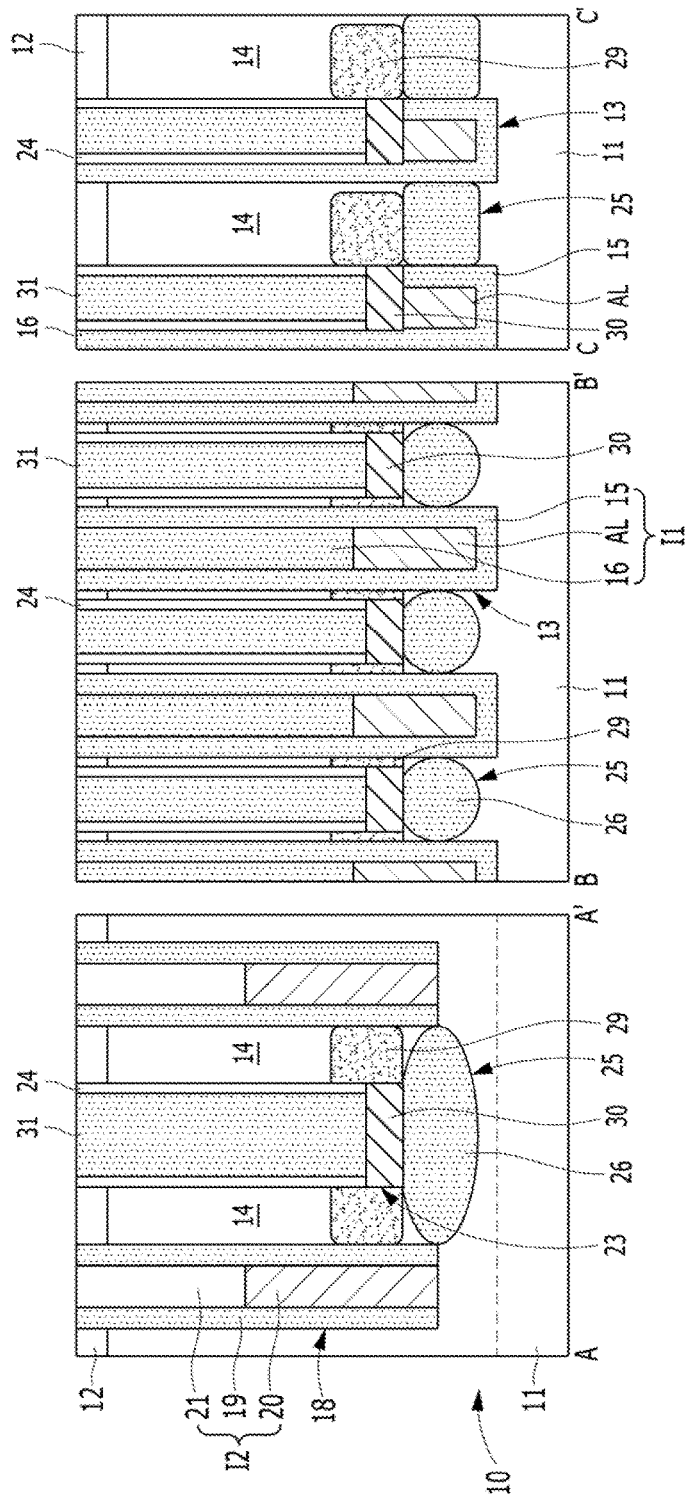

As shown in FIGS. 5H and 6H, the sacrificial spacer 27 may be selectively removed. To cover the bit line 30, a bit line capping layer 31 may be formed to bury the bit line trench 23. Here, the bit line capping layer 31 may include silicon oxide. Subsequently, the bit line capping layer 31 may be planarized until the surface of the first hard mask layer 12 is exposed.

Figure 7A:
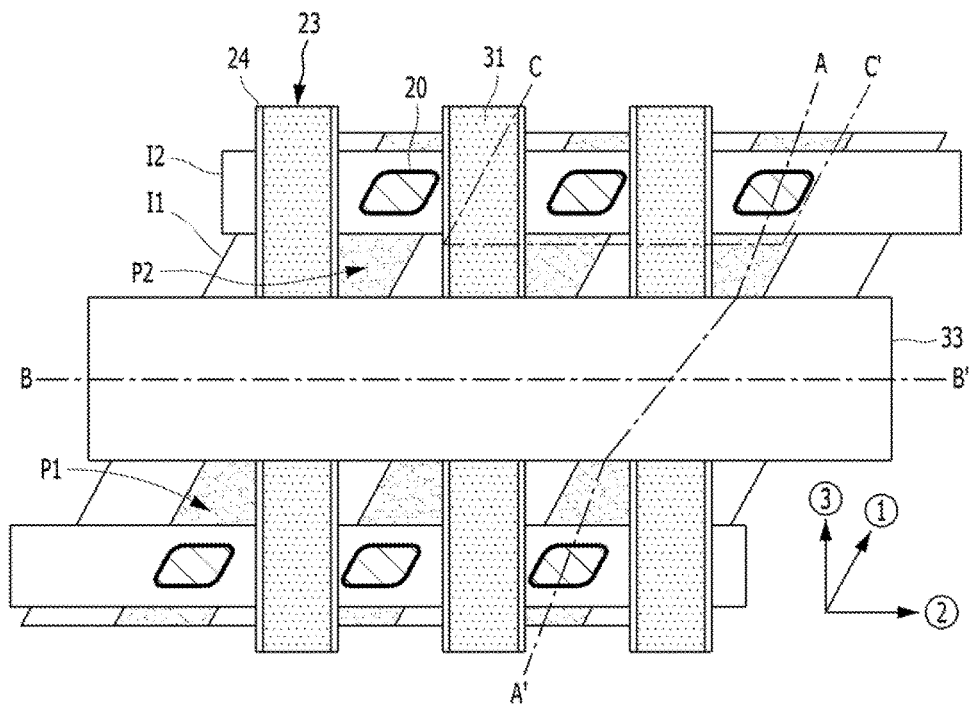
FIGS. 7A to 7H are views illustrating an example of a gate electrode of the semiconductor device in accordance with the first embodiment.

FIGS. 7A to 7H are views illustrating an example of a gate electrode of the semiconductor device in accordance with the first embodiment. FIGS. 8A to 8H are cross-sectional views taken along the lines A-A', B-B' and C-C' of FIG. 7A to 7H. As shown in FIGS. 7A and 8A, a preliminary gate trench 33 may be formed. For example, the preliminary gate trench 33 may be formed by etching the bit line capping layer 31, the first device isolation region I1 and the preliminary pillar 14 by using a third hard mask layer 32 as an etch mask which is annotated with the reference number 32A. An etch process for forming the preliminary gate trench 33 may be performed until the bit line capping layer 31 remains with a given thickness. The preliminary gate trench 33 may extend in a direction crossing with the bit line 30. The preliminary gate trench 33 may extend in the second direction ②. The first junction region 29 may be exposed at the bottom of the preliminary gate trench 33.

A pair of first and second pillars P1 and P2 may be formed by the preliminary gate trench 33. The first and second pillars P1 and P2 may be formed by etching the preliminary pillar 14. Each of the first and second pillars P1 and P2 may become a structure having multi-sidewalls. During the etch process for forming the preliminary gate trench 33, a part of the liner spacer 24 may be etched. Along the line B-B', under the preliminary gate trench 33, the top surfaces of the liner spacer 24, the first device isolation region I1 and the bit line capping layer 31 may be at the same level as one another. The liner spacer 24 may be referred to as a bit line capping liner 24.

Figure 7B:
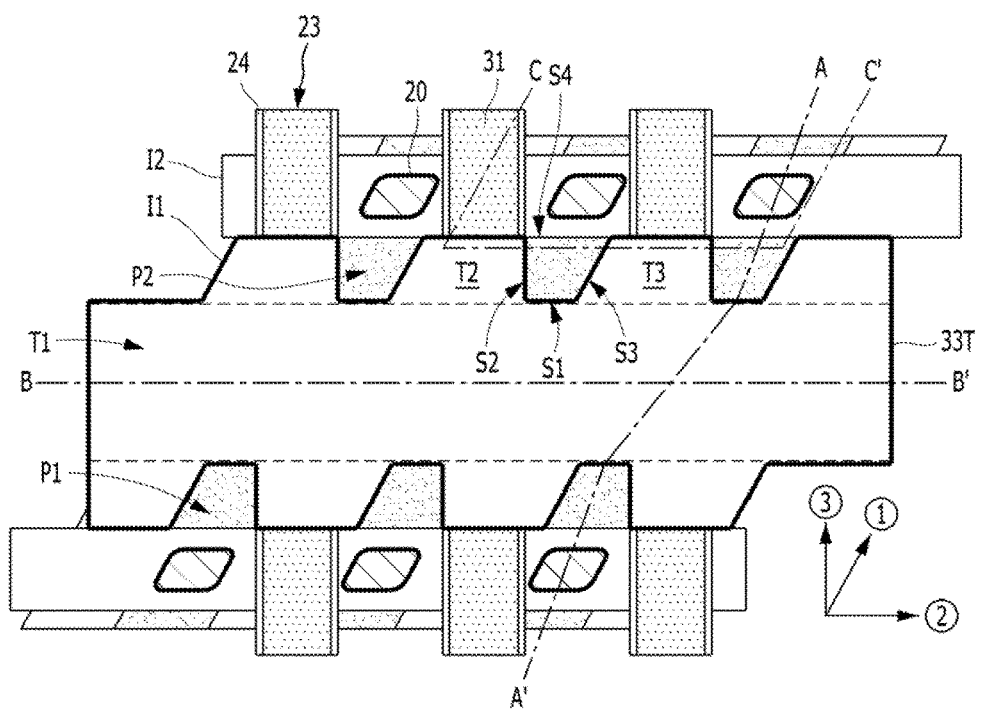
Figure 8A:
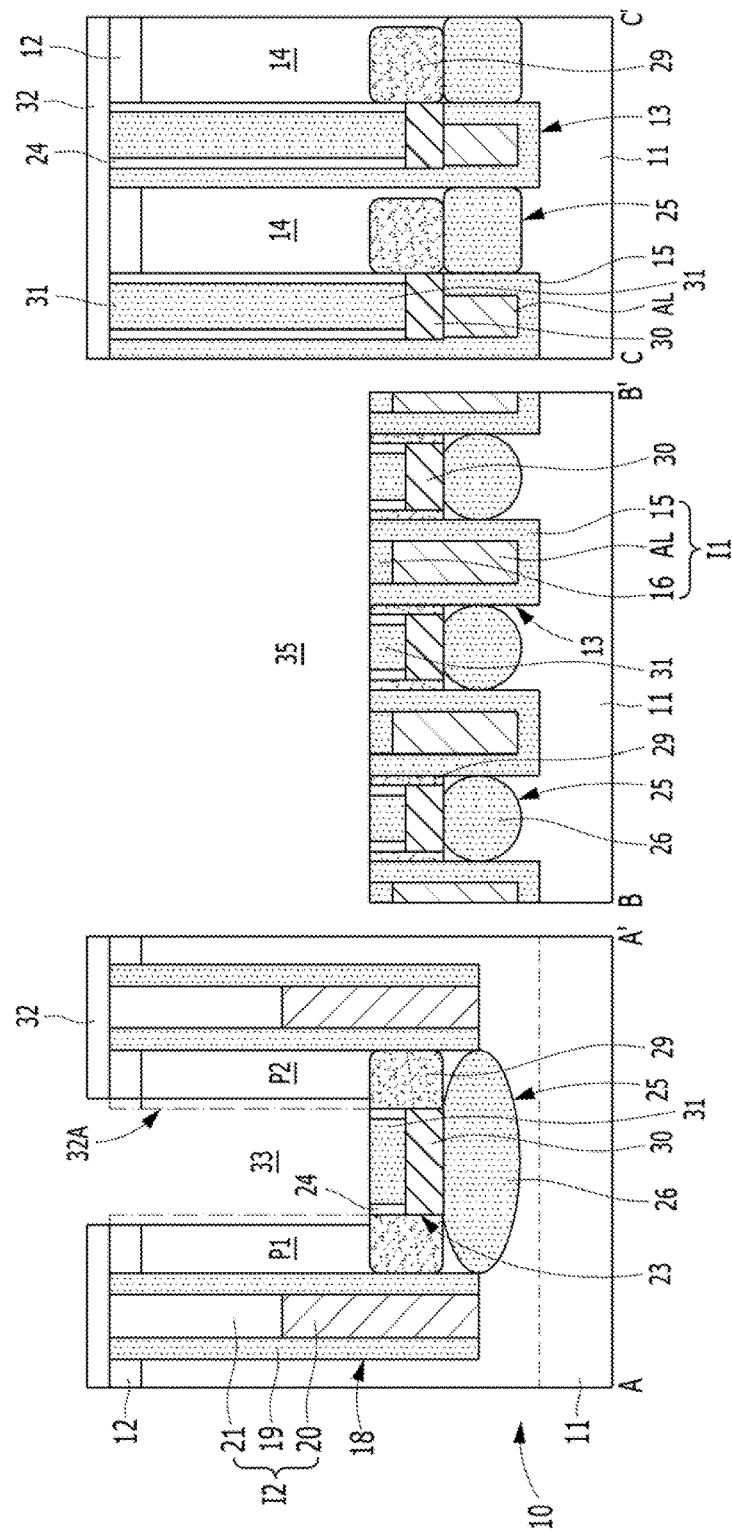
FIGS. 8A to 8H are cross-sectional views taken along the lines A-A', B-B' and C-C' of FIG. 7H.
Figure 8B:
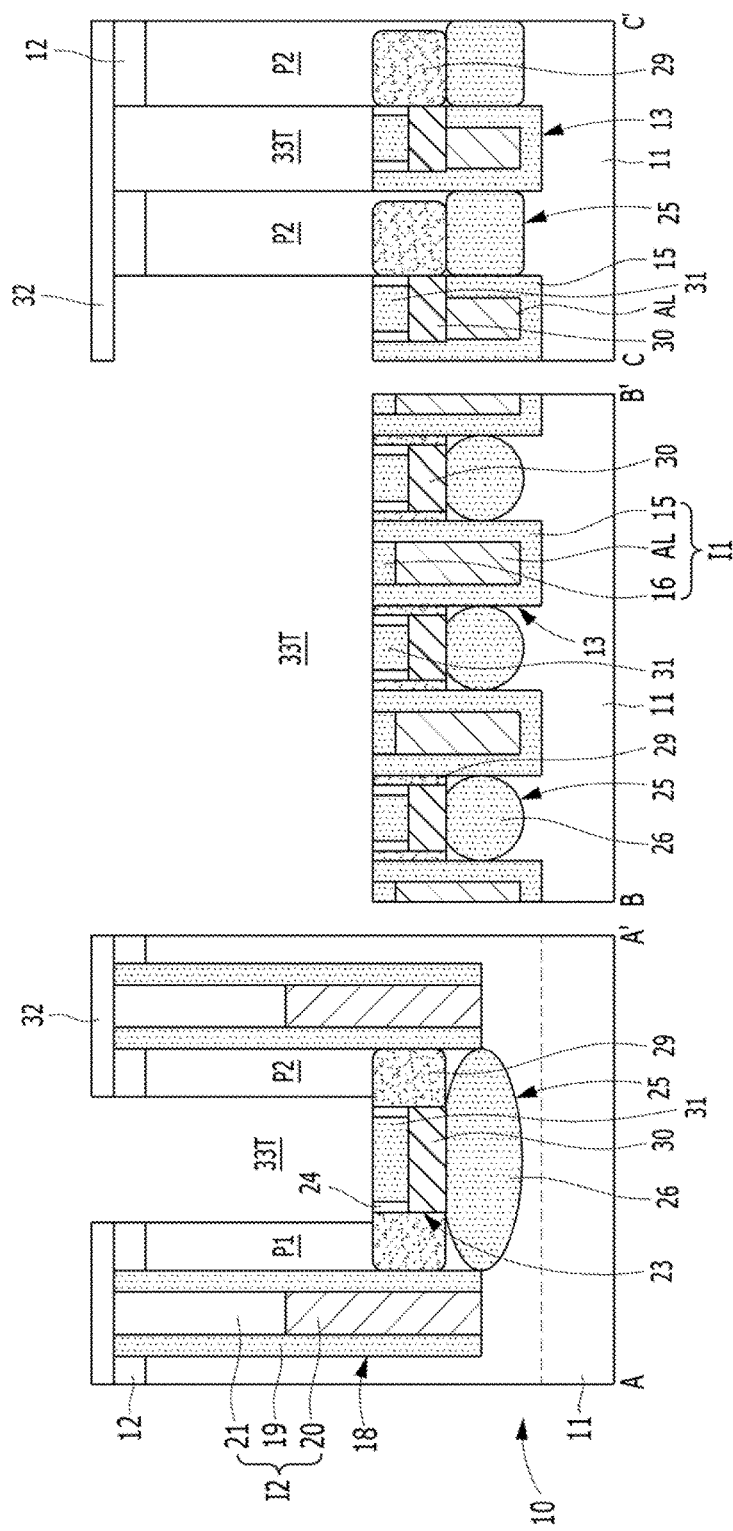

As shown in FIGS. 7B and 8B, an extending process of the preliminary gate trench 33 may be performed. For example, a part of bit line capping layer 31 and a part of the first device isolation region I1 may be selectively etched by a wet etch process. It may be referred to as a widening process. The widening process may use wet etching. The preliminary gate trench 33 may extend in the first direction ① by etching a part of the first device isolation region I1 and a part of the bit line capping layer 31 using wet widening. According to the wet widening process, oxides may be selectively removed. For example, the first liner 15, the first isolation dielectric layer 16, the bit line capping liner 24 and the bit line capping layer 31 may be selectively removed.

A preliminary gate trench extended by the wet widening process may be referred to as a gate trench 33T. The gate trench 33T may include a first trench T1, a second trench T2 and a third trench T3. The first trench T1 may extend in the second direction ②. The first trench T1 may be positioned between the first pillar P1 and the second pillar P2. The second trench T2 and the third trench T3 may branching from the first trench T1. The second trench T2 and the third trench T3 may extend in the first direction ① crossing with the second direction ②.

Side surfaces of the first and second pillars P1 and P2 may be exposed by the first trench T1, the second trench T2 and the third trench T3. For example, a first side surface S1, a second side surface S2 and a third side surface S3 may be exposed. The first side surface S1 may be exposed by the first trench T1, and the second side surface S2 and the third side surface S3 may be exposed by the second trench T2 and the third trench T3, respectively. The second trench T2 and the third trench T3 may be the same as each other in terms of size and shape. The first and second pillars P1 and P2 may include a fourth side surface S4, and the fourth side surface S4 may contact the second device isolation region I2. The second device isolation region I2 may contact the second trench T2 and the third trench T3.

After the wet widening process, the bit line capping layer 31 and the bit line capping liner 24 may remain to a given thickness on the bit line 30.

Figure 7C:
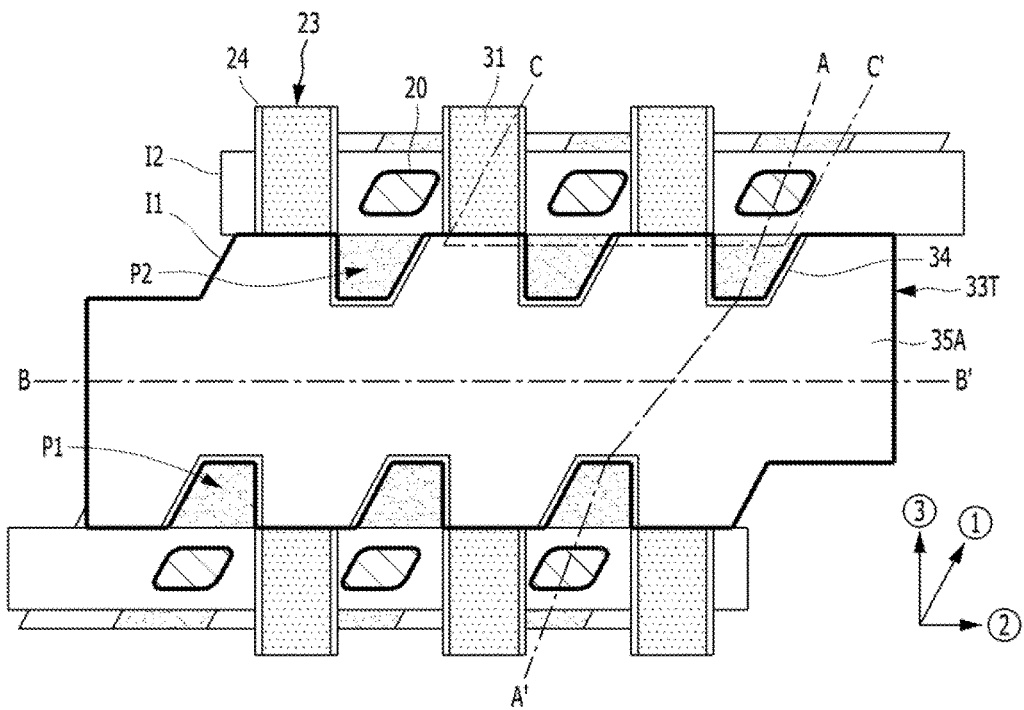
Figure 8C:
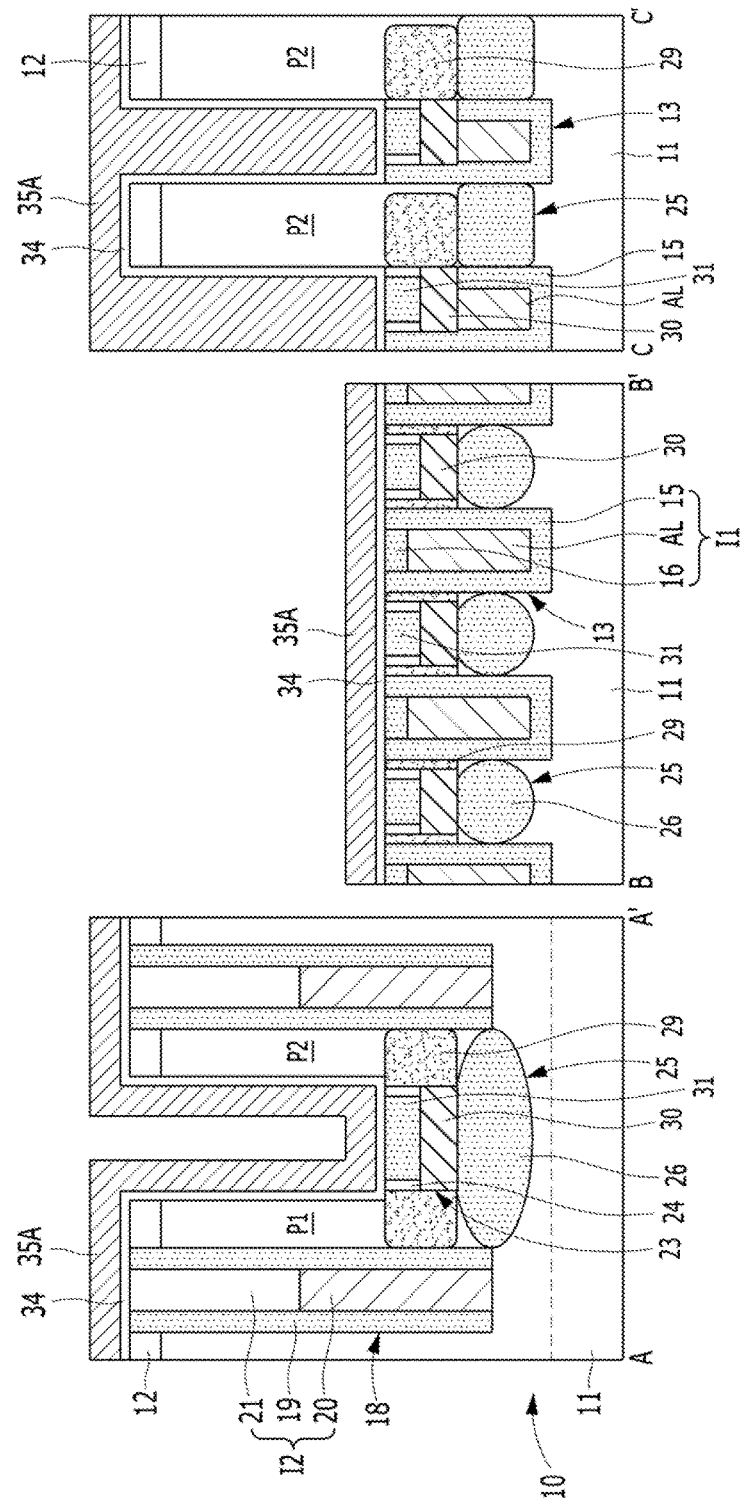

As shown in FIGS. 7C and 8C, the third hard mask layer 32 may be removed. Then, a gate dielectric layer 34 may be formed on the surface of the gate trench 33T.

The gate dielectric layer 34 may be formed by a thermal oxidation process. In another embodiment, the gate dielectric layer 34 may be formed by chemical vapor deposition (CVD) or atomic layer deposition (ALD). The gate dielectric layer 34 may include a high-k material, an oxide, a nitride, an oxynitride or a combination thereof. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. As the high-k material, other high-k materials known in the art may be selectively used.

A first gate conductive layer 35A may be formed on the gate dielectric layer 34. The first gate conductive layer 35A may be conformally formed on the gate trench 33T. The first gate conductive layer 35A may include a low resistivity metal material. The first gate conductive layer 35A may be formed of titanium nitride, tungsten, and so on. In one embodiment, the first gate conductive layer 35A may include a lower barrier layer and a low resistivity layer. Moreover, the first gate conductive layer 35A may include a high work function material in order to control threshold voltage gate. The conductive layer 35A may include TiAlN as the high work function material.

Figure 7D:
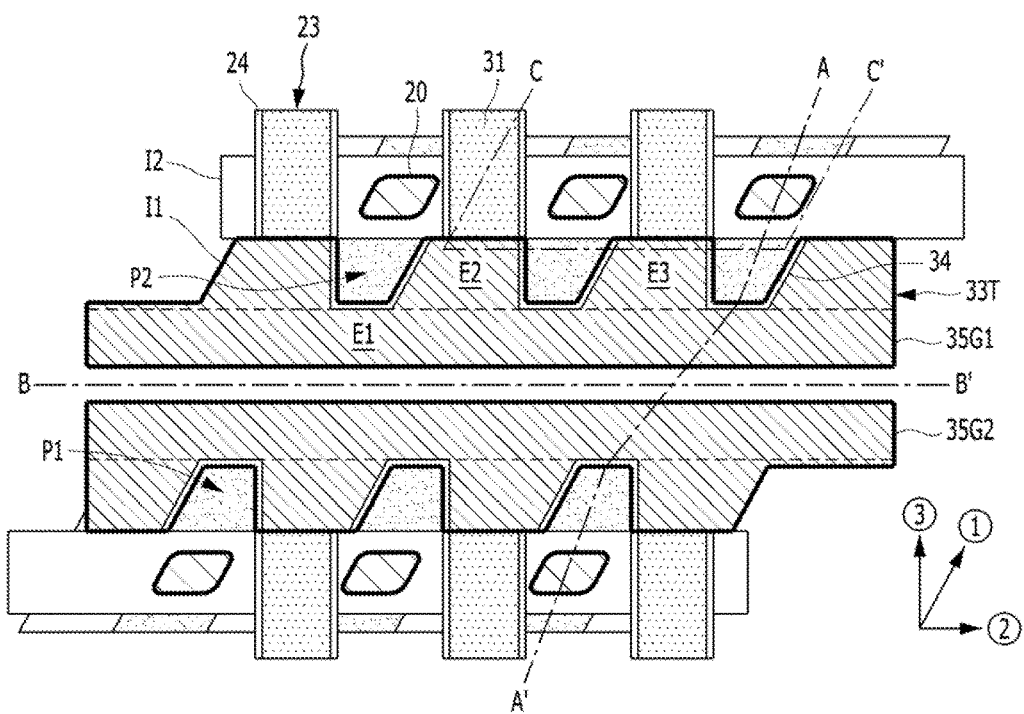
Figure 8D:
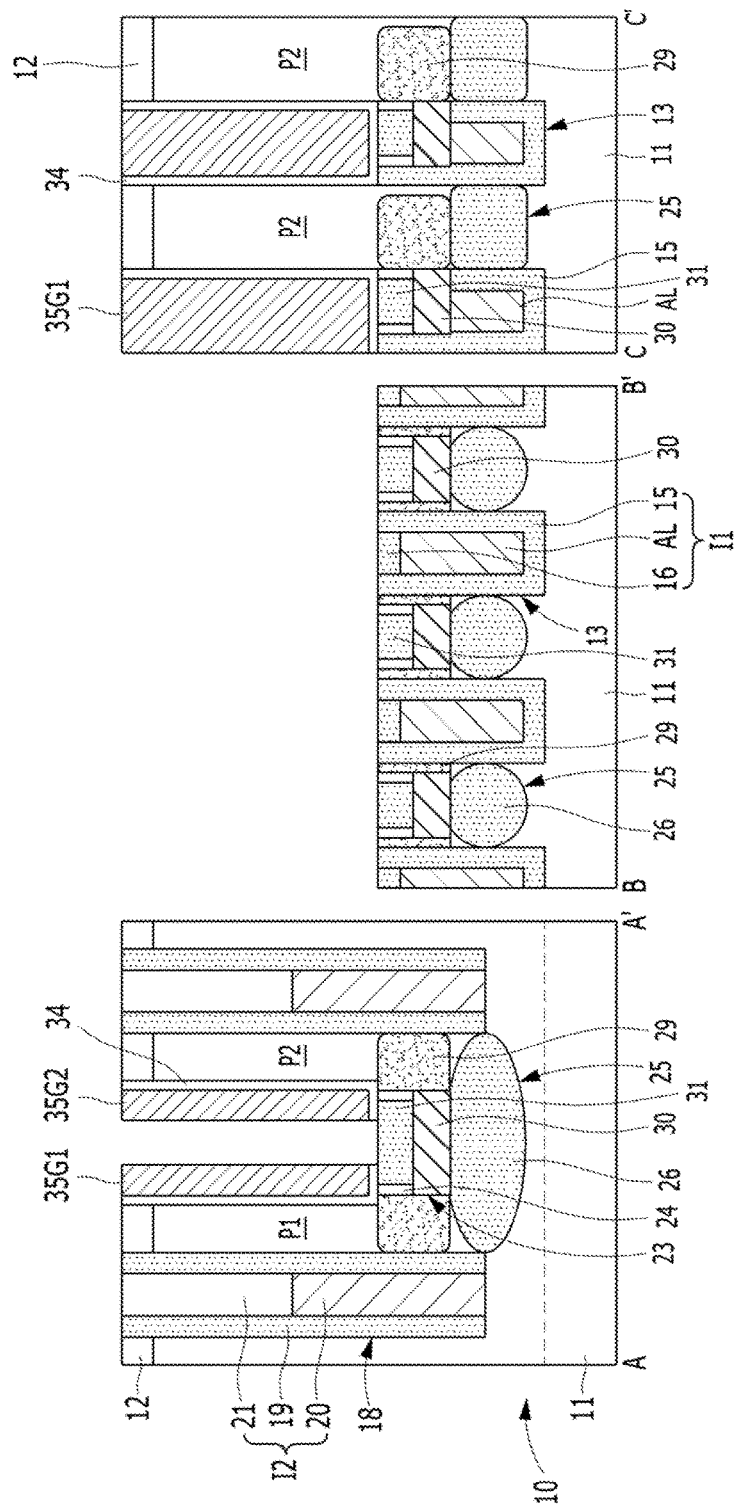

As shown in FIGS. 7D and 8D, a dry etch process may be performed such that preliminary lower gate electrodes 35G1 and 35G2 remain on the sidewalls of the gate trench 33T. For example, it may be performed by an etch-back process. The preliminary lower gate electrodes 35G1 and 35G2 may be formed by etching back the first gate conductive layer 35A. The preliminary lower gate electrodes 35G1 and 35G2 may have a spacer shape partially covering the sidewalls of the first and second pillars P1 and P2, respectively.

The preliminary lower gate electrodes 35G1 and 35G2 may respectively include a first electrode E1, a second electrode E2 and a third electrode E3. The first electrode E1 may extend in the second direction ②, and the second electrode E2 and the third electrode E3 may branching from the first electrode E1. The second electrode E2 and the third electrode E3 may extend in the first direction ①. The first electrode E1, the second electrode E2 and the third electrode E3 may have a shape covering at least three sidewalls of the first and second pillars P1 and P2, respectively. The first electrode E1 may be in a direction crossing with the buried bit line 30, and the second electrode E2 and the third electrode E3 may be positioned between neighboring first pillars P1 or between neighboring second pillars P2.

Figure 7E:
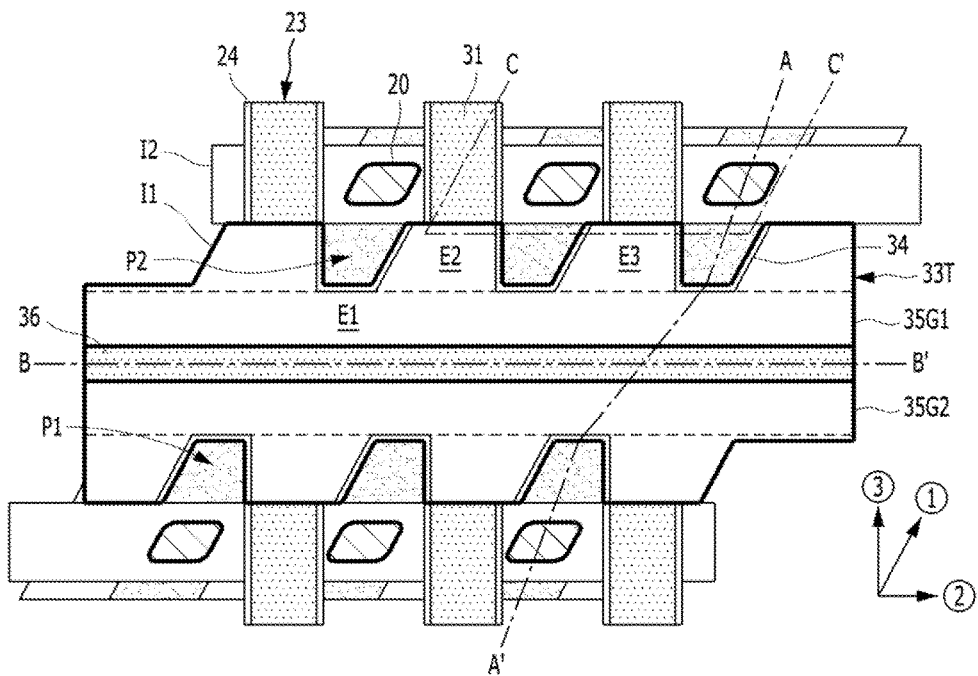
Figure 8E:
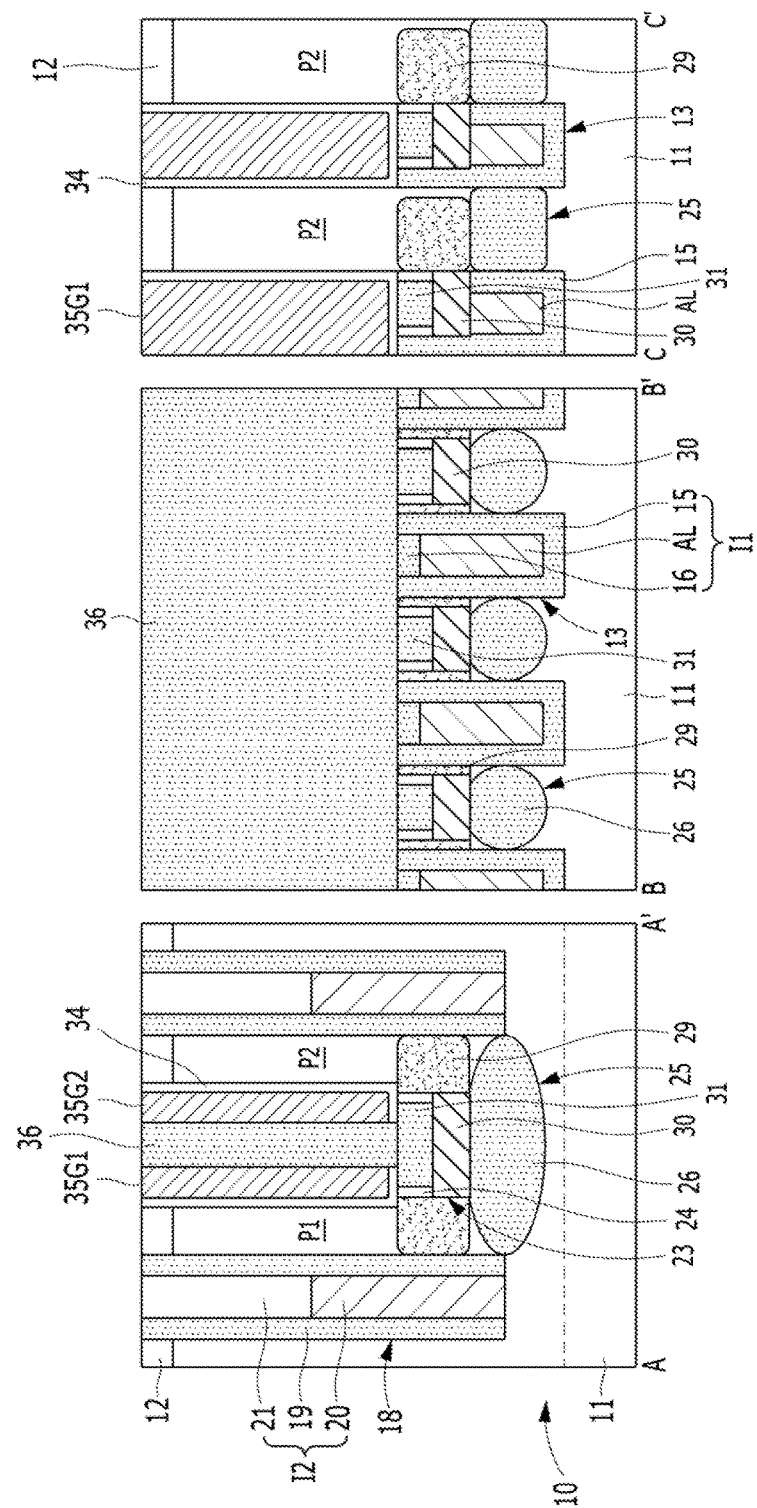

As shown in FIGS. 7E and 8E, a first gate capping layer 36 may be formed. The first gate capping layer 36 may fill the space between the preliminary lower gate electrodes 35G1 and 35G2. The first gate capping layer 36 may be planarized to expose the surfaces of the preliminary lower gate electrodes 35G1 and 35G2.

Figure 7F:
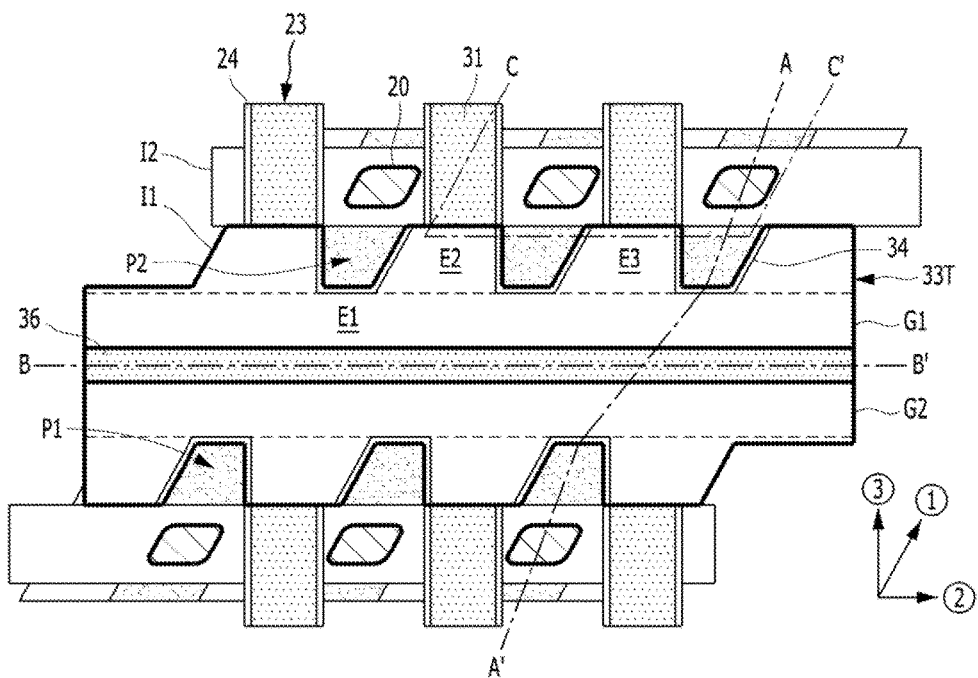
Figure 8F:
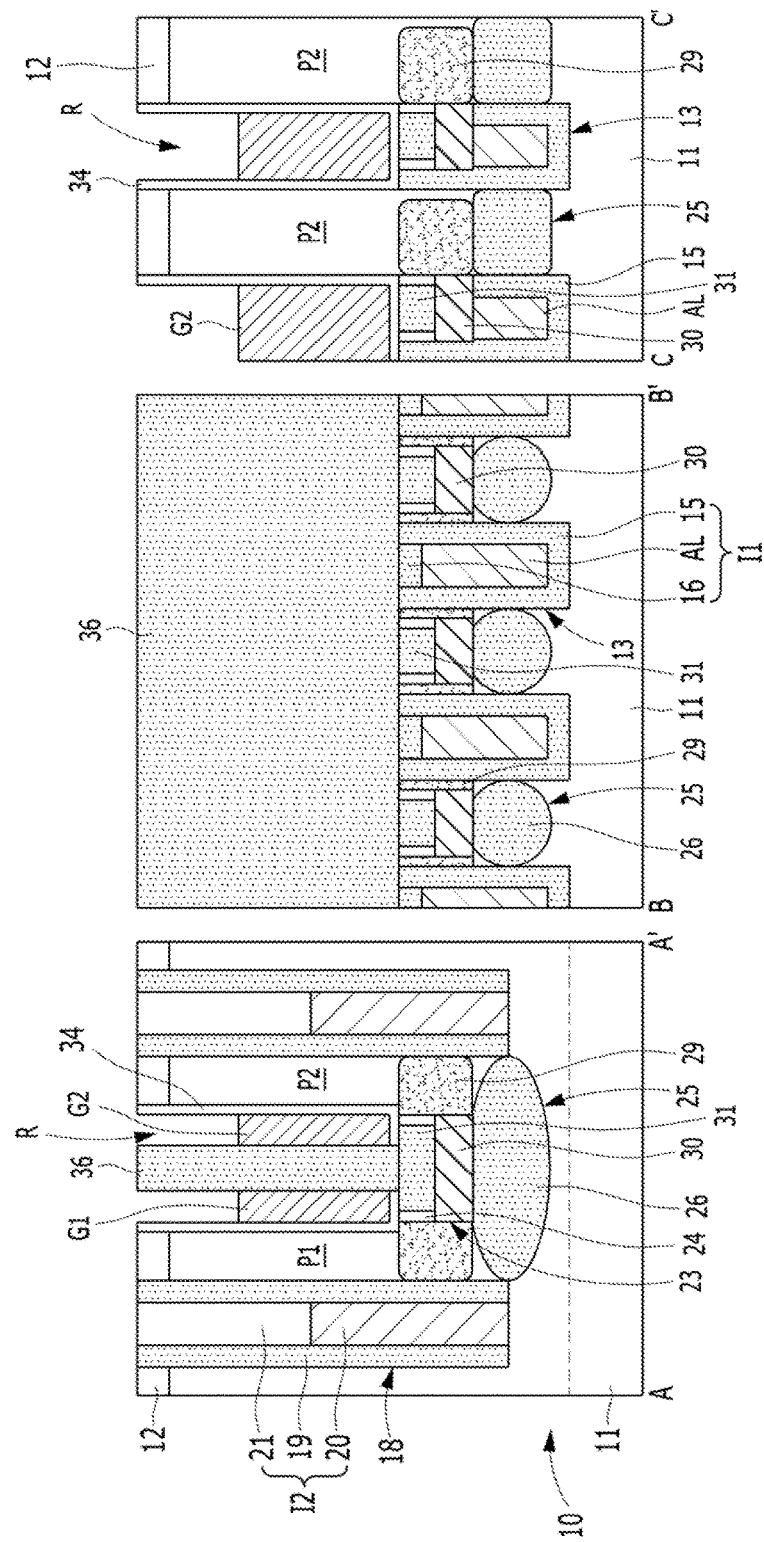

As shown in FIGS. 7F and 8F, the preliminary lower gate electrodes 35G1 and 35G2 may be recessed. See, reference number R. Thus, lower gate electrodes G1 and G2 may be formed.

The lower gate electrodes G1 and G2 may be formed in the gate trench 33T. The lower gate electrodes G1 and G2 may be recessed such that the top surfaces thereof are lower than the top surfaces of the pillars P1 and P2. The first gate capping layer 36 may be positioned between neighboring low gate electrodes G1 and G2.

Figure 7G:
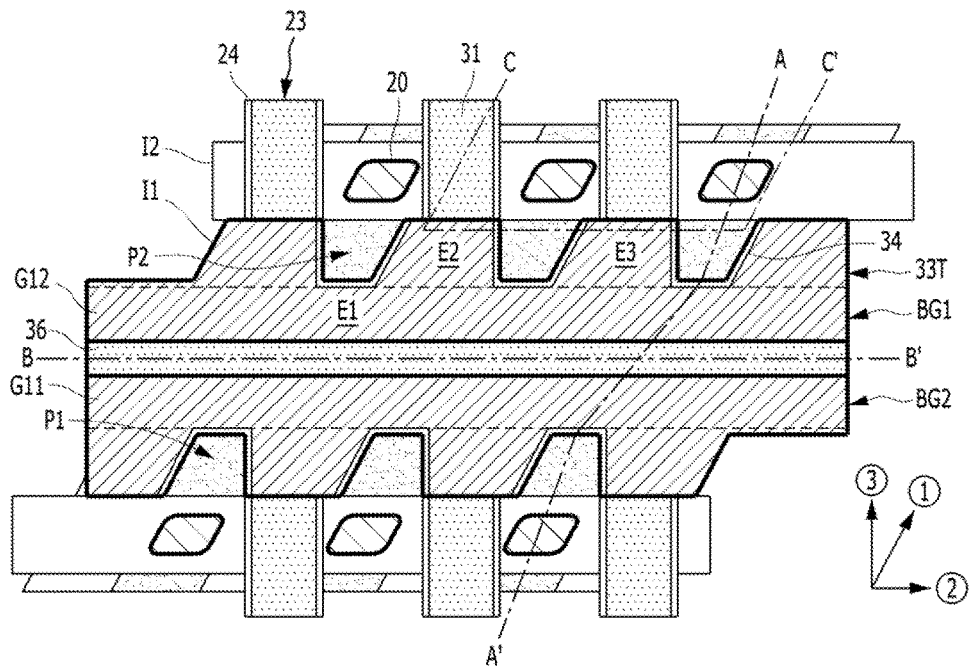
Figure 8G:
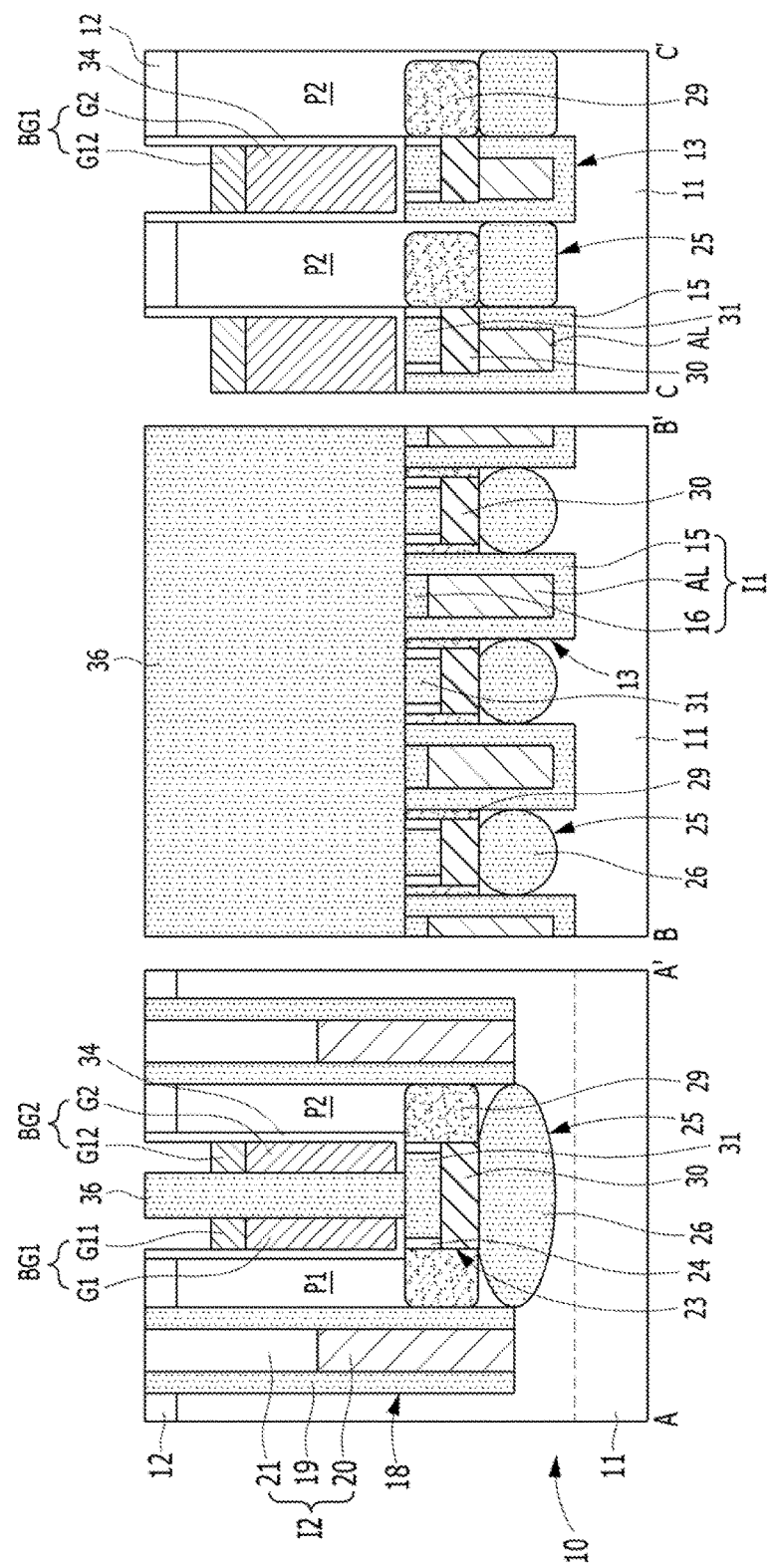

As shown in FIGS. 7G and 8G, upper gate electrodes G11 and G12 may be formed. The upper gate electrodes G11 and G12 may fill the upper portions of the lower gate electrodes G1 and G2, respectively. The upper gate electrodes G11 and G12 may have a recessed surface lower than the top surface of the first gate capping layer 36. To this end, a second gate conductive layer (not shown) may be filled and then an etch-back process may be performed. The upper gate electrodes G11 and G12 may include a low resistivity material. The upper gate electrodes G11 and G12 may be formed of a low work function material to improve gate-induced drain leakage. Moreover, an intermediate barrier may be further formed to prevent a reaction between the lower gate electrodes G1 and G2 and the upper gate electrodes G11 and G12.

According to above description, gate electrodes BG1 and BG2 may include the low gate electrodes G1 and G2 and the upper gate electrodes G11 and G12, respectively.

The gate electrodes BG1 and BG2 may be symmetrical to each other in structure. The gate electrodes BG1 and BG2 may include a first electrode E1 extending in the second direction ②, and a second electrode E2 and a third electrode E3 extending in the first direction ① crossing with the second direction ② and extending from the first electrode E1, respectively. The first electrode E1, the second electrode E2 and the third electrode E3 may be formed in the first trench T1, the second trench T2 and the third trench T3, respectively.

The first, second and third electrodes E1, E2 and E3 may overlap with at least three side surfaces of each of the first and second pillars P1 and P2. The fourth side surfaces S4 of the first and second pillars P1 and P2 may not overlap with the gate electrodes BG1 and BG2, respectively.

Figure 7H:
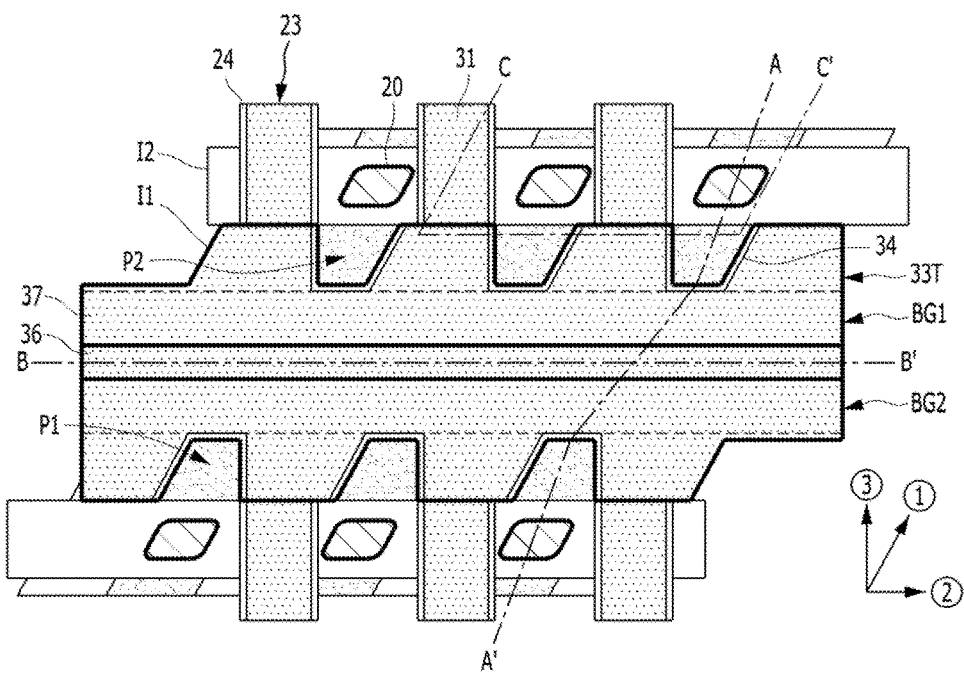
Figure 8H:
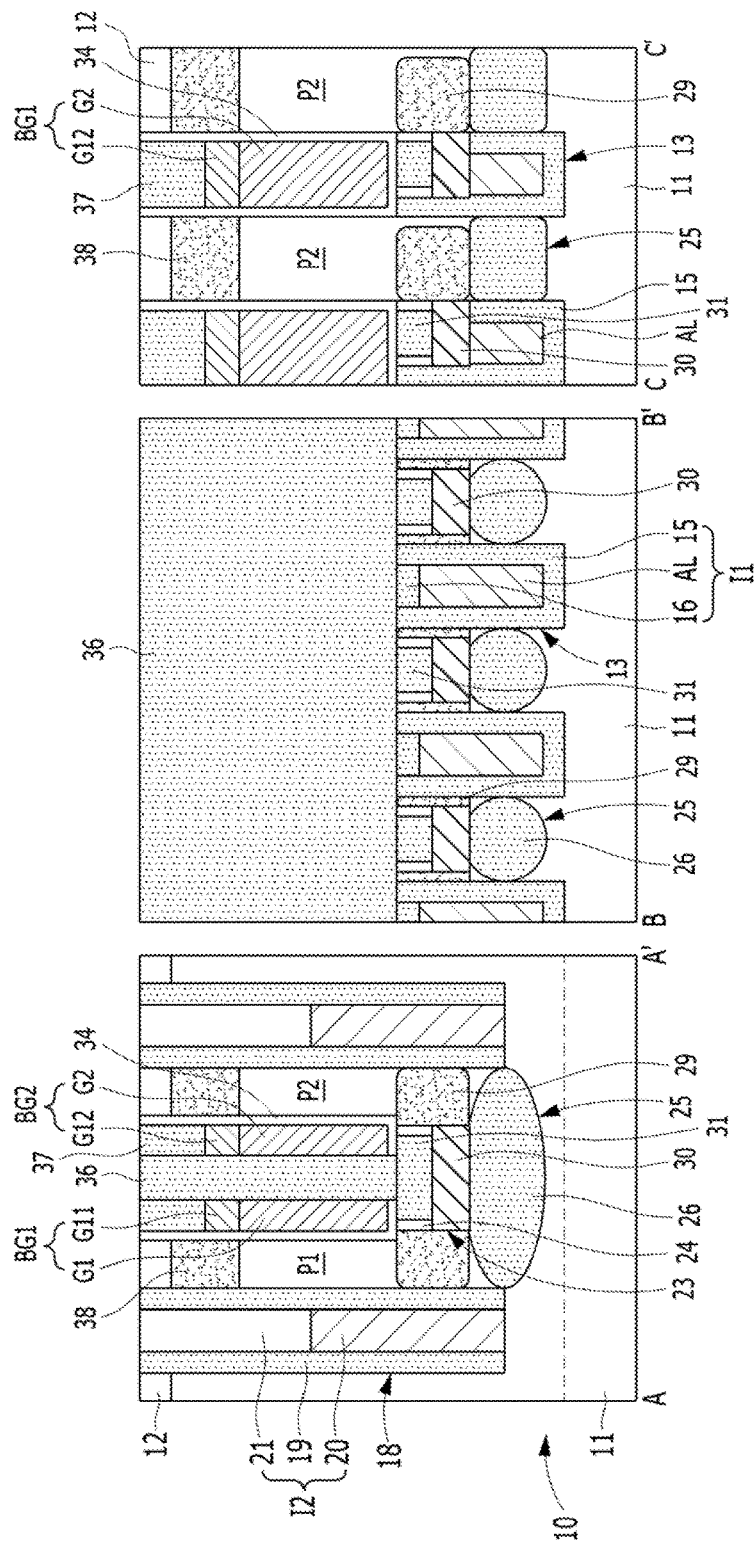

As shown in FIGS. 7H and 8H, a second gate capping layer 37 may be formed. The second gate capping layer 37 may include a dielectric material. The second gate capping layer 37 may fill the upper portion of the upper gate electrodes G11 and G12. The second gate capping layer 37 may include silicon oxide. Subsequently, the second gate capping layer 37 may be planarized such that the top surface of the first hard mask layer 12 is exposed.

After forming the second gate capping layer 37, an impurity doping process may be performed by implantation or other doping techniques. Thus, a second junction region 38 may be formed in the first and second pillars P1 and P2.

When performing the impurity doping process, the first and second gate capping layers 36 and 37 may be used as a barrier. The second junction region 38 may become either a source region or a drain region. A vertical channel may be defined between the first junction region 29 and the second junction region 38.

As described above, the first gate electrode BG1, the first junction region 29 and the second junction region 38 may compose a first transistor Tr1. The second gate electrode BG2, the first junction region 29 and the second junction region 38 may compose a second transistor Tr2. Although it is not shown, a memory element may be electrically coupled to the second junction region 38.

In another embodiment, the second junction region 38 may be formed by an impurity doping process after forming a contact hole. Here, the contact hole may expose the top surfaces of the first and second pillars P1 and P2.

Figure 9:
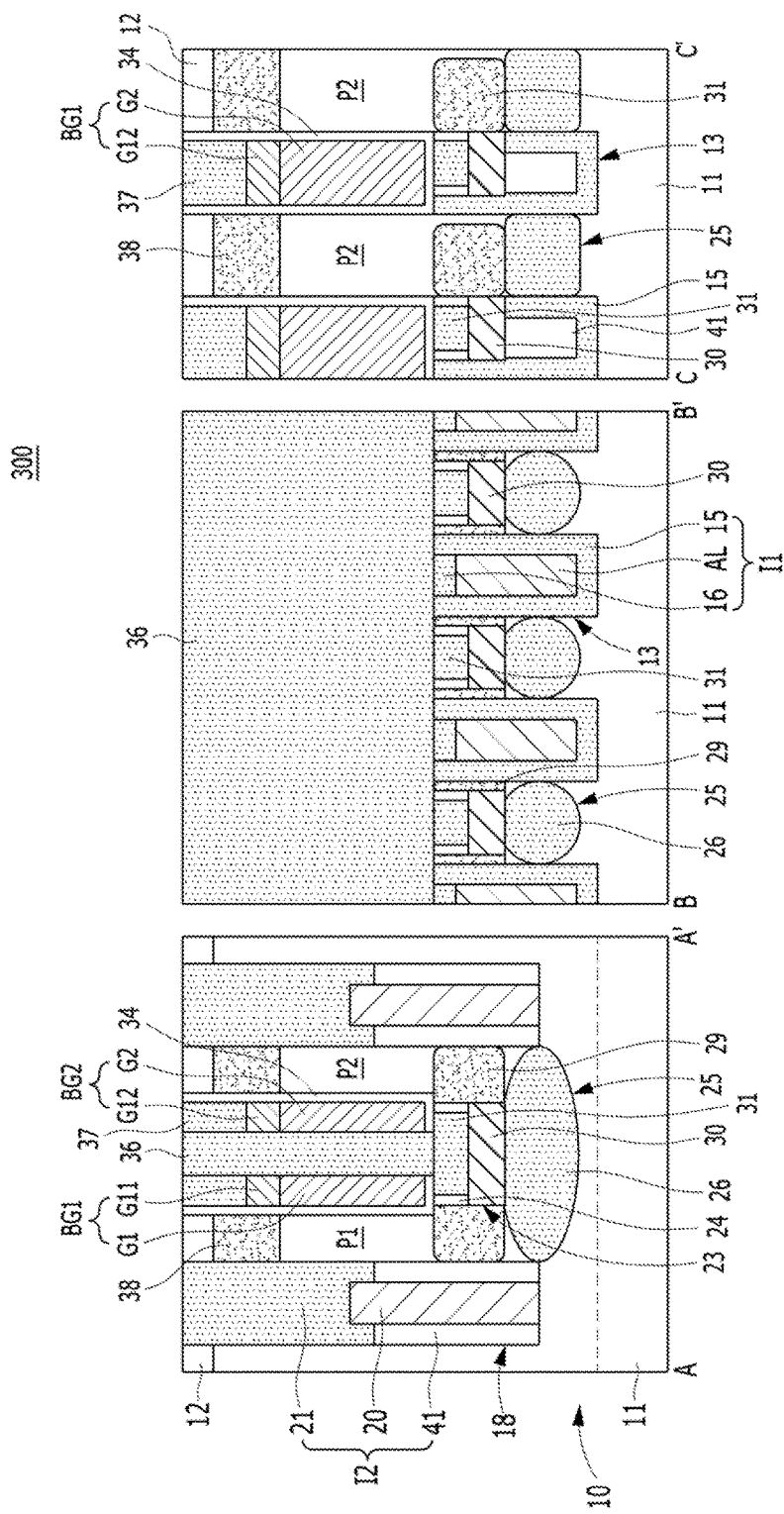
FIG. 9 is a view illustrating a semiconductor device in accordance with a second embodiment.

Hereinafter, a semiconductor device and a method for manufacturing the same in accordance with a second embodiment will be described. FIG. 9 is a view illustrating a semiconductor device in accordance with the second embodiment. A semiconductor device 300 in accordance with the second embodiment may be the same as the first embodiment except for a second device isolation region I2.

Referring to FIG. 9, an air gap 41 may be formed in a second device isolation region I2. The air gap 41 may be formed between a shield pillar 20 and a second isolation trench 18. Therefore, the second device isolation region I2 may include the shield pillar 20, the air gap 41 and a second isolation dielectric layer 21. The air gap 41 may be capped by the second isolation dielectric layer 21.

Parasitic capacitance between neighboring buried bit lines 30 may be reduced by the air gap 41. Moreover, PG effect may be further suppressed.

Figure 10A:
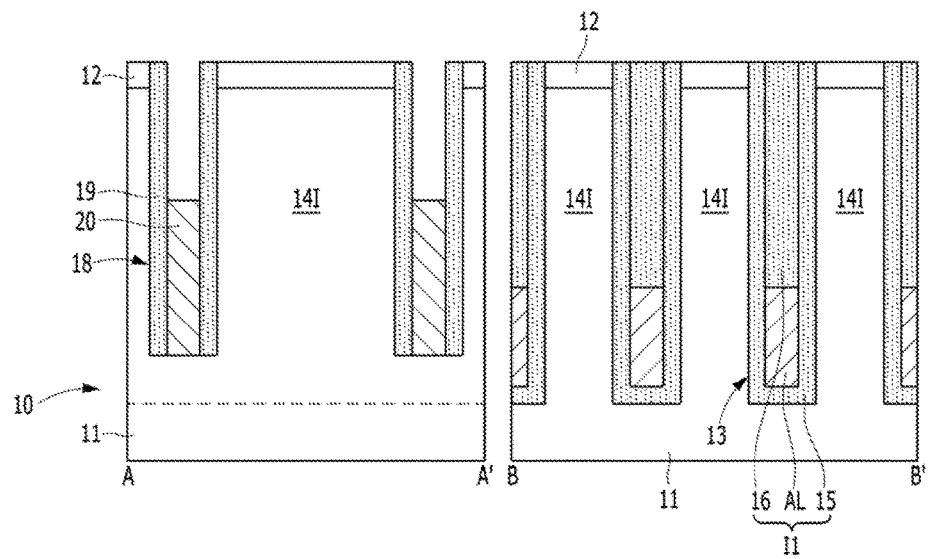
FIGS. 10A to 10C are views illustrating an example of a method for manufacturing the semiconductor in accordance with the second embodiment.
Figure 10B:
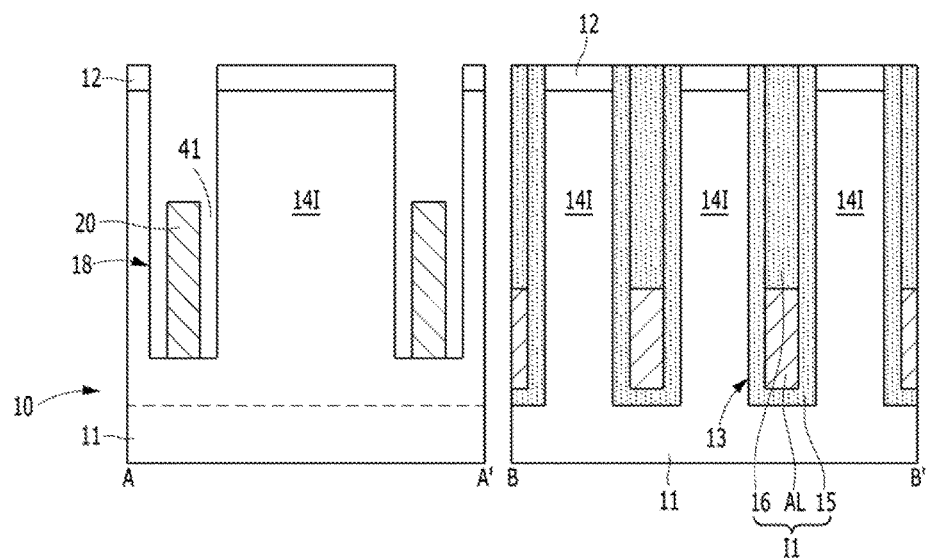
Figure 10C:
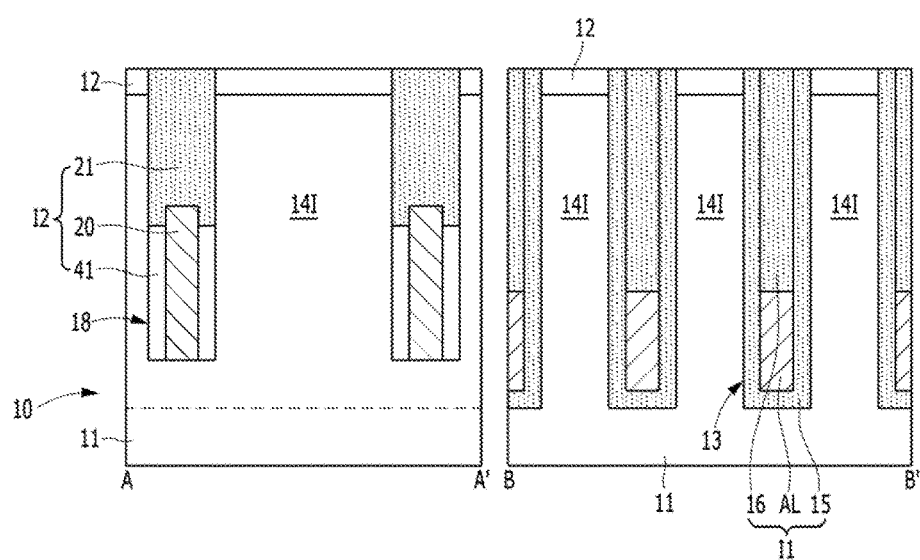

FIGS. 10A to 10C are cross-sectional views illustrating an example of a method for manufacturing the semiconductor in accordance with the second embodiment. In the second embodiment, the method may be the same as or similar to the first embodiment except for a second device isolation region I2 having an air gap 41.

As shown in FIG. 10A, a spacer 19 may be formed on the sidewalls of a second isolation trench 18. To form the spacer 19, a dielectric material may be deposited followed by an etch-back process. The spacer 19 may be formed of a material having etch selectivity with respect to a substrate 10. The spacer 19 may include silicon oxide.

The bottom surface of the second isolation trench 18 may be exposed by the spacer 19.

A shield pillar 20 may be formed. The shield pillar 20 may be formed by selectively etching a shield layer (20A in FIG. 4F). For example, the shield layer 20A may be etched by an etch-back process. Thus, the shield pillar 20 may be formed in the second isolation trench 18. The shield pillar 20 may be independently positioned between the major axes of an active region 14I. That is, neighboring shield pillar 20 may be formed separately from each other. The shield pillar 20 may be recessed such that the top surface thereof is lower than that of the active region 14I. The spacer 19 may be positioned between the sidewalls of the shield pillar 20 and the sidewalls of the second isolation trench 18. The bottom of the shield pillar 20 may contact the substrate 10.

As shown in FIG. 10B, the spacer 19 may be selectively removed. The spacer 19 may be removed by wet etching. Thus, an air gap 41 may be formed.

As shown in FIG. 10C, a second isolation dielectric layer 21 may be formed. The second isolation dielectric layer 21 may be formed of silicon oxide. The second isolation dielectric layer 21 may fill the upper portion of the shield pillar 20. Subsequently, the second isolation dielectric layer 21 may be planarized. Thus, the second isolation dielectric layer 21 may remain to fill the recessed region on the shield pillar 20. The planarized surface of the second isolation dielectric layer 21 may be at the same level as the top surface of the first hard mask layer 12. The air gap 41 may be capped by the second isolation dielectric layer 21.

As described above, a second device isolation region I2 may be formed by forming the second isolation dielectric layer 21. The second device isolation region I2 may include the shield pillar 20, the air gap 41 and the second isolation dielectric layer 21. The second device isolation region I2 may be formed in the second isolation trench 18. The second device isolation region I2 may have the shield pillar 20 and the air gap 41.

Figure 11:
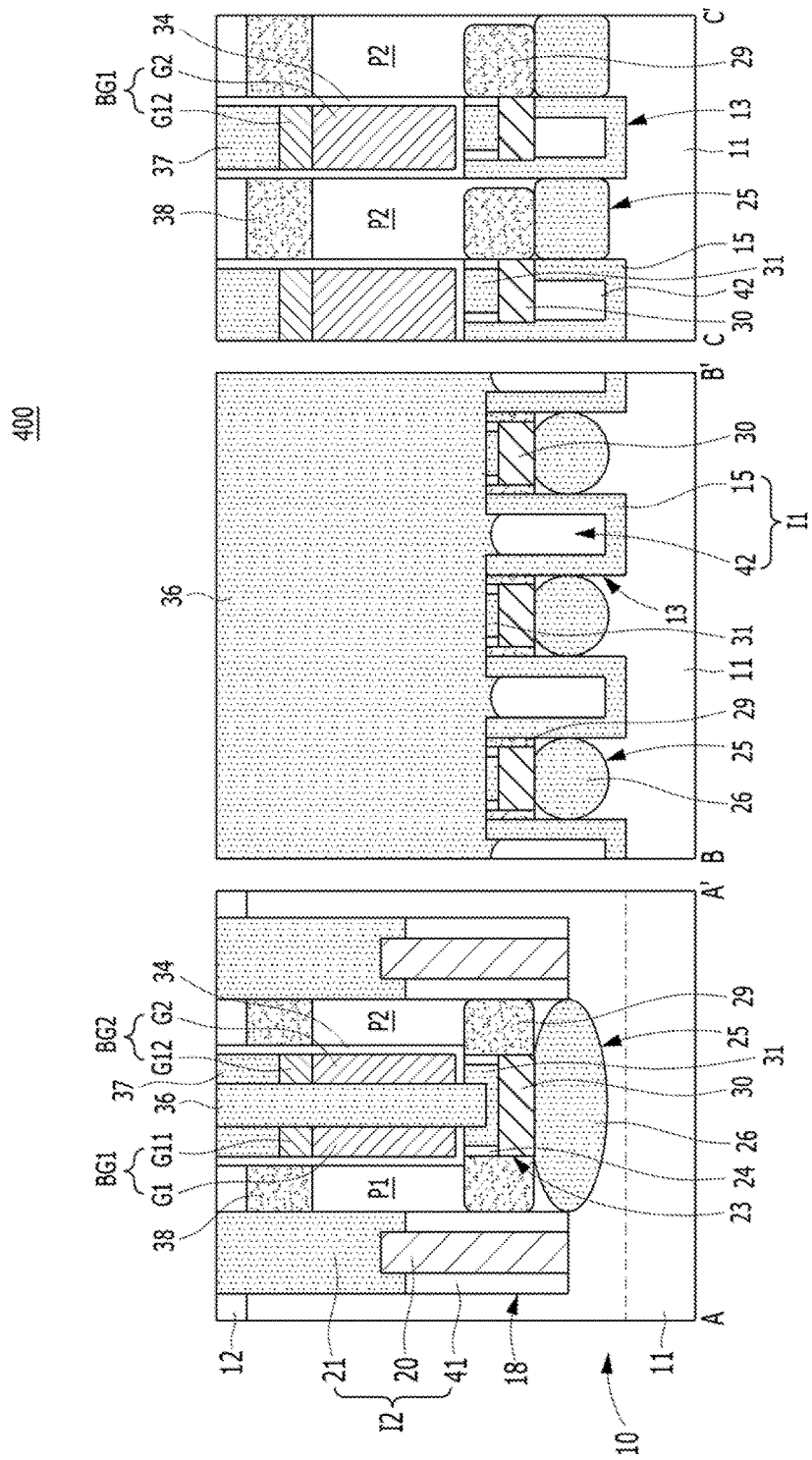
FIG. 11 is a view illustrating a semiconductor device in accordance with a third embodiment.

Hereinafter, a semiconductor device and a method for manufacturing the same in accordance with a third embodiment will be described. FIG. 11 is a view illustrating a semiconductor device in accordance with a third embodiment. A semiconductor device 400 in accordance with a third embodiment may be the same as the second embodiment except for a first device isolation region I1.

Referring to FIG. 11, a first air gap 42 may be formed in the first device isolation region I1. The first air gap 42 may be formed in the first isolation trench 13. Therefore, the first device isolation region I1 may include the first air gap 42 and a first liner 15. The first air gap 42 may be capped by the first gate capping layer 36.

A second air gap 41 may be formed in the second device isolation region I2. The second air gap 41 may be formed in the space between a shield pillar 20 and a second isolation trench 18. Therefore, the second device isolation region I2 may include the shield pillar 20, the second air gap 41 and a second isolation dielectric layer 21. The second air gap 41 may be capped by the second isolation dielectric layer 21.

Parasitic capacitance between neighboring buried bit lines 30 may be reduced by the first air gap 42 and the second air gap 41. Moreover, PG effect may be increased.

FIGS. 12A to 12D are views illustrating an example of a method for manufacturing the semiconductor in accordance with the third embodiment. In the third embodiment, the method may be the same as or similar to the first and second embodiments except for a first device isolation region I1 having an first air gap 42. For example, the first air gap 42 may be formed between a process for forming pillars P1 and P2 and a process for forming gate electrodes BG1 and BG2.

Figure 12A:
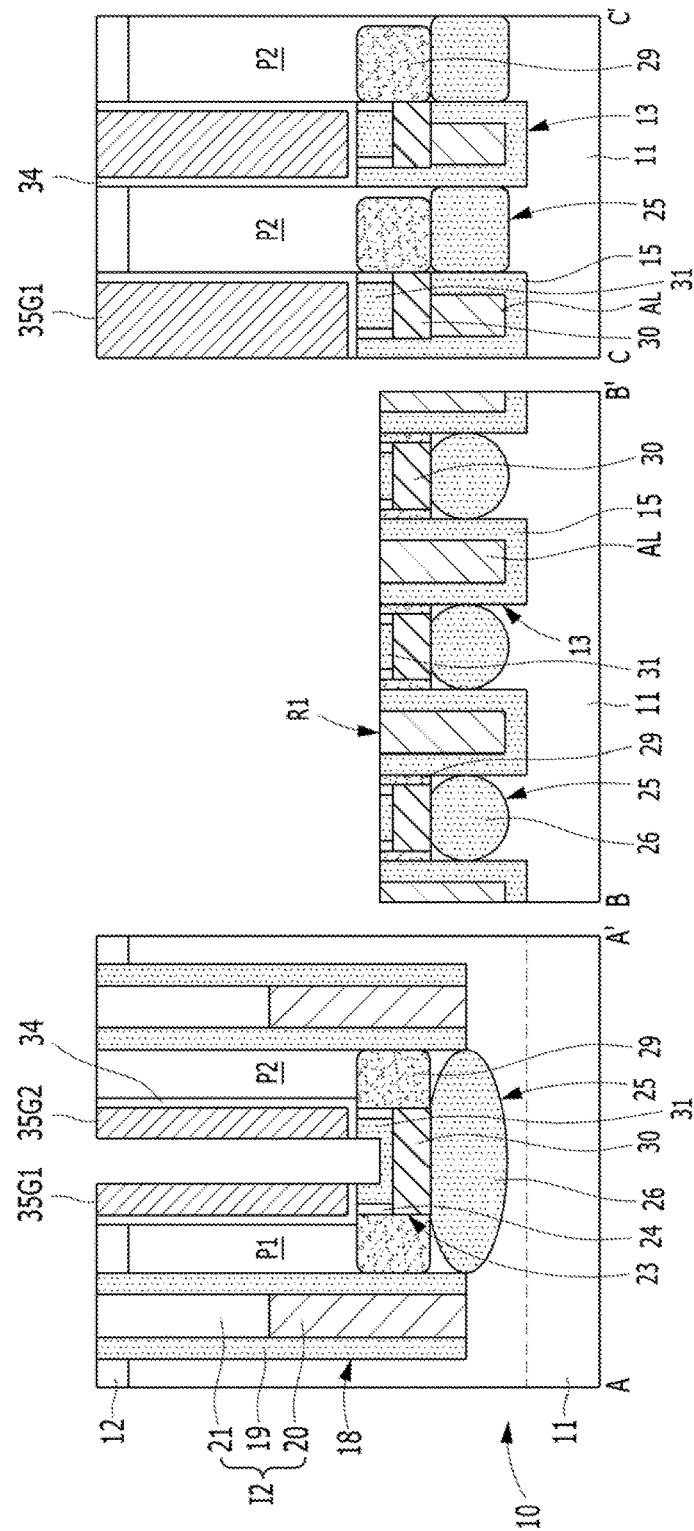
FIGS. 12A to 12D are views illustrating an example of a method for manufacturing the semiconductor in accordance with the third embodiment.

As shown in FIG. 12A, after forming the pillars P1 and P2, a gate dielectric layer 34 may be formed. Then, a dry etch process may be performed such that preliminary lower gate electrodes 35G1 and 35G2 remain on the sidewalls of a gate trench 33T. For example, it may be performed by an etch-back process. The preliminary lower gate electrodes 35G1 and 35G2 may be formed by performing an etch-back process of a gate conductive layer 35A. The etch-back process of the first gate conductive layer 35A may be sufficiently performed to expose a dielectric pillar AL. See, reference number R1. Here, the dielectric pillar AL may be exposed without attacking a buried bit line 30. That is, the dielectric pillar AL may be exposed by removing a first isolation dielectric layer 16.

Figure 12B:
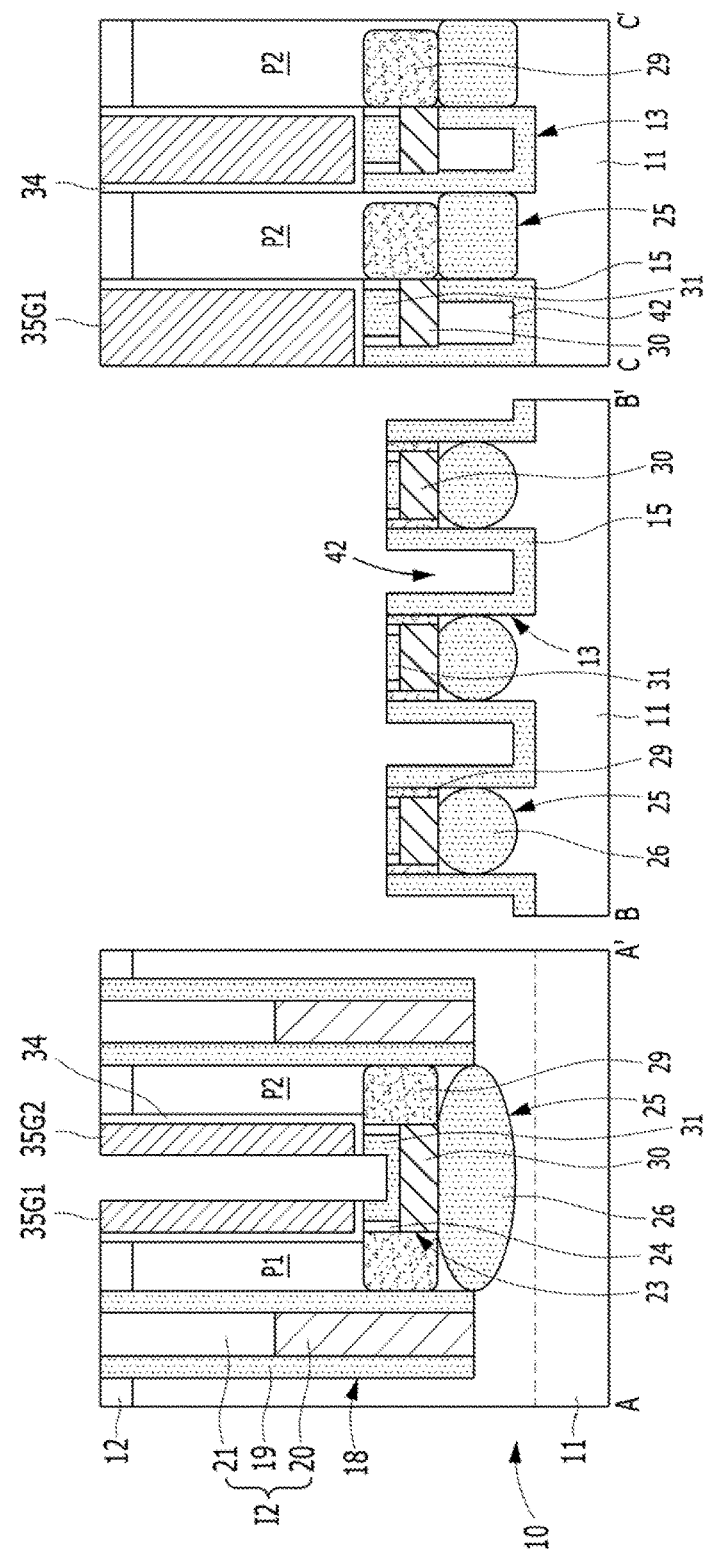

As shown in FIG. 12B, the dielectric pillar AL may be selectively removed. Thus, the first air gap 42 may be formed. When forming the first air gap 42, a first liner 15 may not be removed.

Figure 12C:
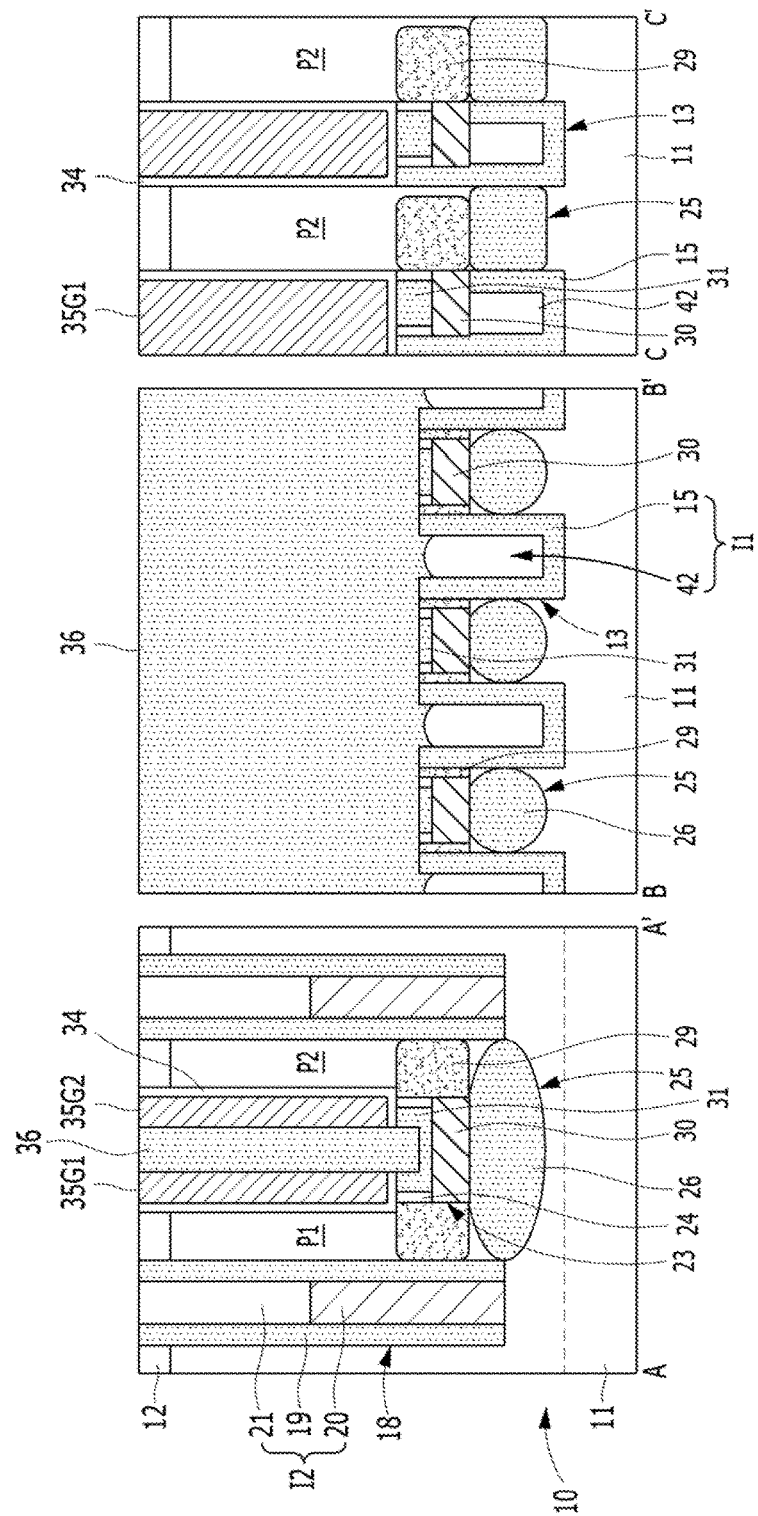

As shown in FIG. 12C, a first gate capping layer 36 may be formed. The first gate capping layer 36 may include a dielectric material. The first gate capping layer 36 may fill the space between the preliminary lower gate electrodes 35G1 and 35G2. The first gate capping layer 36 may include silicon nitride. Subsequently, the first gate capping layer 36 may be planarized such that the top surface of a first hard mask layer 12 is exposed.

During forming the first gate capping layer 36, the top of the first air gap 42 may be capped. That is, the top of the first air gap 42 may be closed by the first gate capping layer 36. In another embodiment, when initially forming the first gate capping layer 36, the first gate capping layer 36 may be thinly formed on the surface of the first liner 15. During continuously forming the first gate capping layer 36, the top of the first air gap 42 may be closed.

Figure 12D:
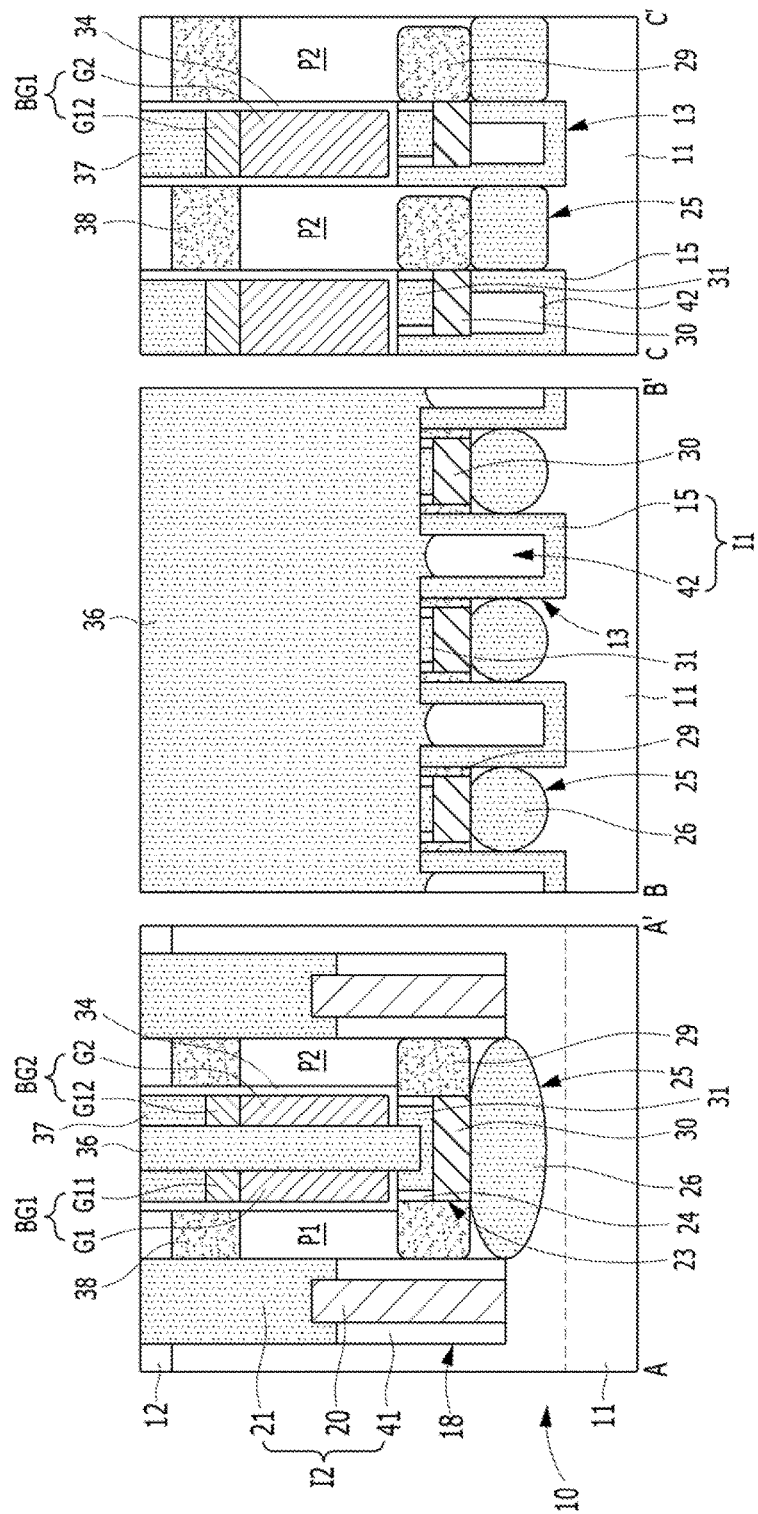

As described above, the first air gap 42 may be formed in the first device isolation region I1. As shown in FIG. 12D, subsequently gate electrodes G1 and G2, a second gate capping layer 37 and a second junction region 38 may be formed according to the method illustrated in FIGS. 8F to 8H.

According to the third embodiment, the first air gap 42 may be positioned between the minor axes of the island type active region 14I. Thus, parasitic capacitance between the minor axes of the island type active region 14I may be reduced.

In accordance with the third embodiment, the second air gap 41 may be positioned between the major axes of the island type active region 14I, and the first air gap 40 may be positioned between the minor axes of the island type active region 14I. Thus, parasitic capacitance between neighboring bit lines 30 may be reduced to improve speed of the semiconductor device. Moreover, PG effect may be further suppressed.

According to the embodiments, a shield pillar formed in a device isolation region may be formed to suppress passing gate effect. Moreover, according to the embodiments, threshold voltage may be controlled by the shield pillar.

Further, according to the embodiments, parasitic capacitance may be reduced by forming the air gap.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
a semiconductor substrate having a plurality of active regions and a device isolation region for isolating the plurality of active regions from each other;
a buried bit line and a buried gate electrode which are formed in the semiconductor substrate;
a gate trench having a bottom surface, a first side surface and a second side surface opposite to the first side surface, wherein the buried gate electrode is embedded in the gate trench,
wherein the device isolation region includes a first device isolation region extending in a first direction and a second device isolation region extending in a second direction crossing with the first direction and having a conductive shield pillar,
wherein the conductive shield pillar has a height that overlaps a portion of the buried gate electrode and the buried bit line,
wherein a top surface of the conductive shield pillar being at a higher level than a bottom surface of the buried gate electrode, and
wherein a bottom surface of the conductive shield pillar being at lower level than a bottom surface of the buried bit line.

2. The semiconductor device according to claim 1, wherein the gate trench comprises:
a first trench extending in the second direction, and
a second trench and a third trench each extending from the first trench and extending in the first direction.

3. The semiconductor device according to claim 2, wherein the buried gate electrode comprises:
a first electrode buried in the first trench of the gate trench;
a second electrode buried in the second trench of the gate trench; and
a third electrode buried in the third trench of the gate trench.

4. The semiconductor device according to claim 1, further comprising a bit line trench extending in a third direction crossing with the first and second directions,
wherein the buried bit line is embedded in the bit line trench.

5. The semiconductor device according to claim 1, wherein the active region comprises a body and a pillar vertically extending over the body,
wherein the pillar comprises:
a first junction region electrically coupled to the buried bit line;
a second junction region vertically positioned from the first junction region; and
a channel region positioned between the first junction region and the second junction region, and overlapping with the buried gate electrode.

* * * * *